(12) United States Patent
Zhao et al.

(10) Patent No.: US 12,550,585 B2
(45) Date of Patent: Feb. 10, 2026

(54) LIGHT-EMITTING DEVICE AND METHOD FOR MANUFACTURING THE SAME, AND LIGHT-EMITTING APPARATUS

(71) Applicant: BOE TECHNOLOGY GROUP CO., LTD., Beijing (CN)

(72) Inventors: Xiyu Zhao, Beijing (CN); Mengyang Wen, Beijing (CN); Xuan Tao, Beijing (CN); Chen Ping, Beijing (CN); Guanqin Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 435 days.

(21) Appl. No.: 18/255,238

(22) PCT Filed: May 31, 2022

(86) PCT No.: PCT/CN2022/096432
§ 371 (c)(1),
(2) Date: May 31, 2023

(87) PCT Pub. No.: WO2023/230906
PCT Pub. Date: Dec. 7, 2023

(65) Prior Publication Data
US 2024/0357901 A1    Oct. 24, 2024

(51) Int. Cl.
*H10D 86/40* (2025.01)
*H10K 59/82* (2023.01)
(Continued)

(52) U.S. Cl.
CPC ........... *H10K 59/82* (2023.02); *H10D 86/481* (2025.01); *H10K 59/84* (2023.02); *H10K 71/60* (2023.02)

(58) Field of Classification Search
CPC ...... H10K 59/84; H10K 59/82; H10K 59/131; H10K 71/60; H01L 25/167; G09G 2300/06; H02J 50/10; H10D 86/481
See application file for complete search history.

(56) References Cited

U.S. PATENT DOCUMENTS 10,984,704 B2 * 4/2021 Huang .................... G09G 3/32
2008/0042558 A1    2/2008 Buchhauser et al.
(Continued)

FOREIGN PATENT DOCUMENTS

CN        110082976 A    8/2019
CN        113178534 A    7/2021

*Primary Examiner* — Eric K Ashbahian
(74) *Attorney, Agent, or Firm* — XSENSUS LLP

(57) ABSTRACT

A light-emitting device includes: a substrate, at least one induction coil located on a side of the substrate, and at least two light-emitting units. The induction coil includes turns of conductive wiring. The light-emitting units are located on a side of the induction coil away from the substrate; each light-emitting unit includes a first electrode and a second electrode, and a first electrode and a second electrode of a same light-emitting unit are electrically connected to different turns of conductive wiring of a same induction coil; the light-emitting units include at least one first-type light-emitting unit and at least one second-type light-emitting unit. An equivalent number of turns of conductive wiring between a first electrode and a second electrode of a first-type light-emitting unit is different from an equivalent number of turns of conductive wiring between a first electrode and a second electrode of a second-type light-emitting unit.

20 Claims, 24 Drawing Sheets

(51) Int. Cl.
  *H10K 59/84*  (2023.01)
  *H10K 71/60*  (2023.01)

(56)   References Cited

U.S. PATENT DOCUMENTS

2020/0365626  A1    11/2020  Lin et al.
  2025/0246589  A1*   7/2025   Lee ..................... H01L 25/167

* cited by examiner

PVX

PLN

530

531
402/420/400
401/420/400    403/420/400

PDL

PDL0
PDL1 PDL1 PDL1

540

520

512

552

530

PDL

540

520

540
EML /403    EML /404
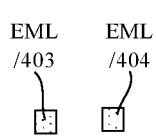
EML/ 404    EML/ 403
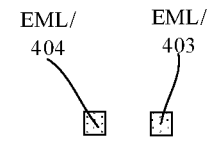
EML /403    EML /404
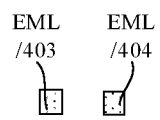
EML/ 404    EML/ 403
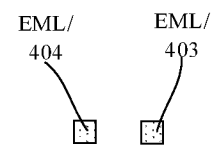
FIG. 29

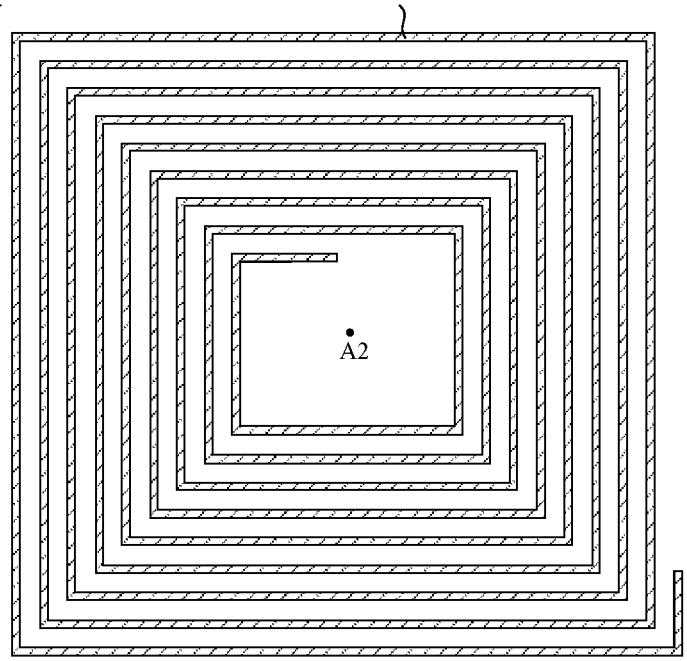
FIG. 35
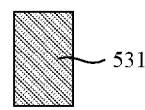
FIG. 36

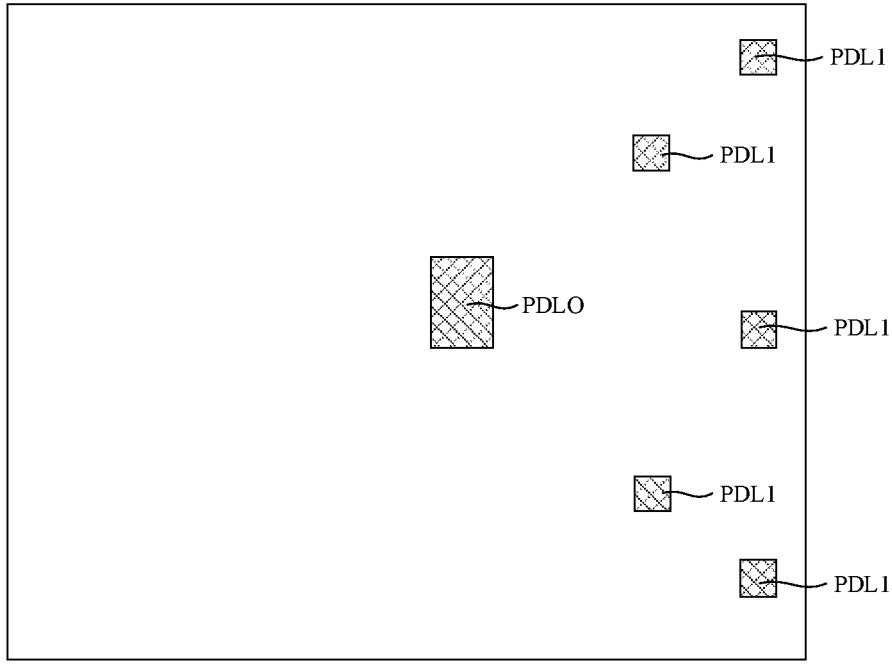
FIG. 37
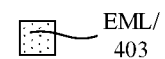
FIG. 38

520

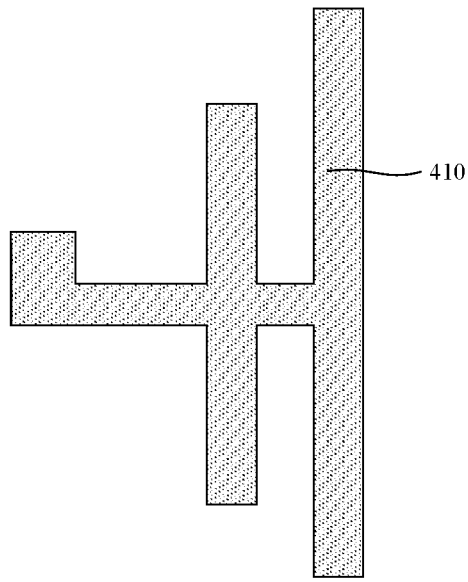

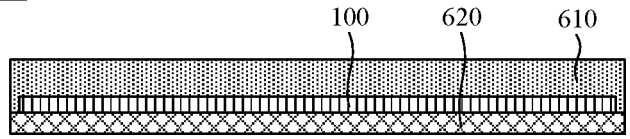

FIG. 40

| Form at least one induction coil on the substrate, the induction coil including a plurality of turns of conductive wiring | S1 |

| Form at least two light-emitting units on a side of the at least one induction coil away from the substrate, each light-emitting unit including a first electrode and a second electrode, and a first electrode and a second electrode of a same light-emitting unit being electrically connected to different turns of conductive wiring of a same induction coil; the at least two light-emitting units including a first-type light-emitting unit and a second-type light-emitting unit, and an equivalent number of turns of conductive wiring between a first electrode and a second electrode of the first-type light-emitting unit being different from an equivalent number of turns of conductive wiring between a first electrode and a second electrode of the second-type light-emitting unit | S2 |

FIG. 41

LIGHT-EMITTING DEVICE AND METHOD FOR MANUFACTURING THE SAME, AND LIGHT-EMITTING APPARATUS

CROSS-REFERENCE TO RELATED APPLICATION

This application is a national phase entry under 35 USC 371 of International Patent Application No. PCT/CN2022/096432, filed on May 31, 2022, which is incorporated herein by reference in its entirety.

TECHNICAL FIELD

The present disclosure relates to the field of display technologies, and in particular, to a light-emitting device and a method for manufacturing the same, and a light-emitting apparatus.

BACKGROUND

When a driving coil is connected to a power source, a receiving coil is driven by the driving coil to induce a current. A light-emitting unit is connected to the receiving coil, and thus the light-emitting unit may be driven by the receiving coil to emit light.

SUMMARY

In an aspect, a light-emitting device is provided. The light-emitting device includes: a substrate, at least one induction coil and at least two light-emitting units. The at least one induction coil is located on a side of the substrate, and the induction coil includes a plurality of turns of conductive wiring. The at least two light-emitting units are located on a side of the induction coil away from the substrate; each light-emitting unit includes a first electrode and a second electrode, and a first electrode and a second electrode of a same light-emitting unit are electrically connected to different turns of conductive wiring of a same induction coil; the at least two light-emitting units include at least one first-type light-emitting unit and at least one second-type light-emitting unit, and an equivalent number of turns of conductive wiring between a first electrode and a second electrode of a first-type light-emitting unit in the at least one first-type light-emitting unit is different from an equivalent number of turns of conductive wiring between a first electrode and a second electrode of a second-type light-emitting unit in the at least one second-type light-emitting unit.

In some embodiments, the at least one induction coil includes at least one first-type induction coil. The first electrode of the first-type light-emitting unit in the at least one first-type light-emitting unit and the first electrode of the second-type light-emitting unit in the at least one second-type light-emitting unit are electrically connected to a designated end of a first-type induction coil in the at least one first-type induction coil; the second electrode of the first-type light-emitting unit in the at least one first-type light-emitting unit and the second electrode of the second-type light-emitting unit in the at least one second-type light-emitting unit are electrically connected to different turns of conductive wiring of the first-type induction coil in the at least one first-type induction coil. The first-type induction coil is helically disposed around a first central point thereof and spreads out; the designated end of the first-type induction coil is an end of the first-type induction coil proximate to the first central point, or an end of the first-type induction coil away from the first central point.

In some embodiments, a plurality of first-type induction coils are provided, and the plurality of first-type induction coils are insulated from each other.

In some embodiments, regions surrounded by outermost turns of conductive wirings of at least two first-type induction coils are partially overlapped in a thickness direction of the substrate.

In some embodiments, the at least one induction coil includes a second-type induction coil, and the second-type induction coil includes a plurality of sub-coils; each sub-coil is helically disposed around a respective second central point and spreads out; an end of each sub-coil proximate to the respective second central point surrounded thereby is electrically connected to one another to form a first connection end, and an end of each sub-coil away from the respective second central point surrounded thereby is electrically connected to one another to form a second connection end.

The first electrode of the first-type light-emitting unit in the at least one first-type light-emitting unit and the first electrode of the second-type light-emitting unit in the at least one second-type light-emitting unit are electrically connected to a designated end of the second-type induction coil, and the second electrode of the first-type light-emitting unit in the at least one first-type light-emitting unit and the second electrode of the second-type light-emitting unit in the at least one second-type light-emitting unit are electrically connected to different turns of conductive wiring of the second-type induction coil.

In some embodiments, a plurality of first-type light-emitting units are provided, and second electrodes of the plurality of first-type light-emitting units are electrically connected to conductive wirings of sub-coils in the plurality of sub-coils, the conductive wirings being in a same turn; and/or a plurality of second-type light-emitting units are provided, and second electrodes of the plurality of second-type light-emitting units are electrically connected to conductive wirings of sub-coils in the plurality of sub-coils, the conductive wirings being in a same turn.

In some embodiments, the plurality of sub-coils are arranged in a same layer. The light-emitting device further includes at least one connecting wiring located on a side of the plurality of sub-coils away from the substrate. Ends of the plurality of sub-coils proximate to respective second central points surrounded thereby are electrically connected through a connecting wiring. Ends of the plurality of sub-coils away from the respective second central points surrounded thereby are electrically connected through another connecting wiring; or the ends of the plurality of sub-coils away from the respective second central points surrounded thereby converge to a same position.

In some embodiments, one of the first electrode and the second electrode of the light-emitting unit is closer to the substrate than another thereof. The at least one connecting wiring is arranged in a same layer as the one of the first electrode and the second electrode closer to the substrate.

In some embodiments, the plurality of sub-coils are sequentially arranged in a thickness direction of the substrate and away from the substrate, and orthographic projections of the plurality of sub-coils on the substrate are at least partially overlapped.

In some embodiments, in any two adjacent sub-coils, an orthographic projection, on the substrate, of at least one end of a sub-coil that is closer to the substrate is located outside of an orthographic projection, on the substrate, of a sub-coil that is farther away from the substrate.

In some embodiments, the light-emitting device further includes a first electrode layer and a second electrode layer, both of which are located on the side of the induction coil away from the substrate. The first electrode layer is located on a side of the second electrode layer away from the substrate; the first electrode of each light-emitting unit is included in the first electrode layer, and the second electrode of each light-emitting unit is included in the second electrode layer.

The second electrode layer further includes a bridging pattern, the first electrode of each light-emitting unit is connected to the bridging pattern through a via hole, and the bridging pattern is connected to the induction coil through another via hole. The second electrode of each light-emitting unit is electrically connected to the induction coil through yet another via hole.

In some embodiments, each light-emitting unit further includes a light-emitting layer located between the first electrode and the second electrode.

In another aspect, a light-emitting apparatus is provided. The light-emitting apparatus includes: a first protective layer, a second protective layer, and the light-emitting device provided in any one of the embodiments above. The light-emitting device is located between the first protective layer and the second protective layer.

In yet another aspect, a method for manufacturing a light-emitting device is provided. The method for manufacturing the light-emitting device includes: forming at least one induction coil on a substrate, the induction coil including a plurality of turns of conductive wiring; and forming at least two light-emitting units on a side of the at least one induction coil away from the substrate, each light-emitting unit including a first electrode and a second electrode, and a first electrode and a second electrode of a same light-emitting unit being electrically connected to different turns of conductive wiring of a same induction coil; the at least two light-emitting units including a first-type light-emitting unit and a second-type light-emitting unit, and an equivalent number of turns of conductive wiring between a first electrode and a second electrode of the first-type light-emitting unit being different from an equivalent number of turns of conductive wiring between a first electrode and a second electrode of the second-type light-emitting unit.

In some embodiments, the first-type light-emitting unit and the second-type light-emitting unit share the first electrode.

In some embodiments, the light-emitting device further includes at least one conductive layer. The plurality of first-type induction coils are located in a same conductive layer or at least two conductive layers.

In some embodiments, conductive wirings of the at least two first-type induction coils are partially overlapped.

In some embodiments, an orthographic projection, on the substrate, of an end of any one of the plurality of first-type induction coils proximate to a first central point thereof does not overlap with an orthographic projection, on the substrate, of a conductive wiring of any other of the plurality of first-type induction coils.

In some embodiments, each sub-coil includes a head end and a tail end; the head end is the end of the sub-coil proximate to the respective second central point surrounded thereby, and the tail end is the end of the sub-coil away from the respective second central point surrounded thereby. In the two adjacent sub-coils, an orthographic projection, on the substrate, of a head end of the sub-coil that is closer to the substrate is located outside of the orthographic projection, on the substrate, of the sub-coil that is farther away from the substrate; and/or in the two adjacent sub-coils, an orthographic projection, on the substrate, of a tail end of the sub-coil that is closer to the substrate is located outside of the orthographic projection, on the substrate, of the sub-coil that is farther away from the substrate.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

FIG. 29 is a structural diagram of a light-emitting film layer of a light-emitting device, in accordance with some embodiments;

FIG. 35 is a structural diagram of a fifth conductive layer of a light-emitting device, in accordance with some embodiments;

FIG. 36 is a structural diagram of a second electrode layer of a light-emitting device, in accordance with some embodiments;

FIG. 37 is a structural diagram of a pixel defining layer of a light-emitting device, in accordance with some embodiments;

FIG. 38 is a structural diagram of a light-emitting film layer of a light-emitting device, in accordance with some embodiments;

FIG. 39 is a structural diagram of a first electrode layer of a light-emitting device, in accordance with some embodiments;

FIG. 40 is a structural diagram of a light-emitting apparatus, in accordance with some embodiments;

FIG. 41 is a flow diagram of a method for manufacturing a light-emitting device, in accordance with some embodiments.

DETAILED DESCRIPTION

Figure 1:
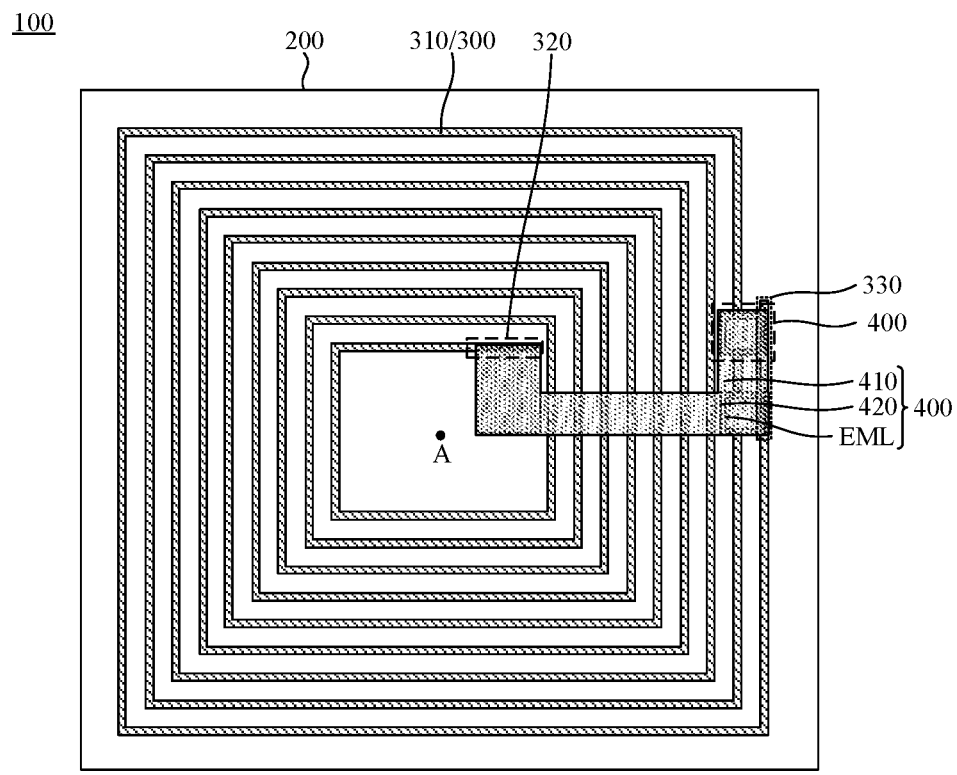
FIG. 1 is a structural diagram of a light-emitting device, in accordance with some embodiments.

Technical solutions in some embodiments of the present disclosure will be described clearly and completely below with reference to the accompanying drawings.

Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "some embodiments", "example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, terms such as "coupled" and derivatives thereof may be used. For example, the term "connected" may be used in the description of some embodiments to indicate that two or more components are in direct physical or electrical contact with each other. The embodiments disclosed herein are not necessarily limited to the context herein.

The phrase "A and/or B" includes the following three combinations: only A, only B, and a combination of A and B.

In addition, the phase "based on" used is meant to be open and inclusive, since a process, step, calculation or other action that is "based on" one or more of the stated conditions or values may, in practice, be based on additional conditions or value exceeding those stated.

As used herein, terms such as "substantially" or "approximately" include a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

As used herein, terms such as "parallel", "perpendicular" or "equal" include a stated condition and a condition similar to the stated condition. A range of the similar condition is within an acceptable range of deviation, and the acceptable range of deviation is determined by a person of ordinary skill in the art in view of measurement in question and the error associated with the measurement of a particular quantity (i.e., the limitation of the measurement system). For example, the term "parallel" includes absolute parallelism and approximate parallelism, and an acceptable range of deviation of the approximate parallelism may be, for example, a deviation within 5°. The term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of approximate equality may be, for example, that a difference between two equals is less than or equal to 5% of any one of the two equals.

It can be understood that, in a case where a layer or component is referred to as being on another layer or a substrate, it may be that the layer or component is directly on the another layer or substrate; or it may be that intermediate layer(s) exist between the layer or component and the another layer or substrate.

Exemplary embodiments are described herein with reference to sectional views and/or plan views as idealized exemplary drawings. In the drawings, thicknesses of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

Some embodiments of the present disclosure provide a light-emitting device.

FIG. 1 is a structural diagram of the light-emitting device 100, in accordance with some embodiments. Referring to FIG. 1, the light-emitting device 100 includes a substrate 200, at least one induction coil 300 and at least two light-emitting units 400.

The substrate 200 may be made of a rigid insulating material or a flexible insulating material. The substrate 200 may be an inorganic insulating layer, such as a glass plate, a quartz plate, a metal plate, or a resin plate. For example, the substrate 200 is made of silicon nitride or silicon oxide. The substrate 200 may also be an organic insulating layer. For example, the substrate 200 is made of a resin material, such as polyimide resin, polycarbonate, polyacrylate, polyetherimide, polyethersulfone, polyethylene terephthalate, and polyethylene naphthalate. For example, the substrate 200 may be formed of multiple material layers, and the material layer may be made of the material mentioned above.

The induction coil 300 may be made of a metal material. For example, the metal material may be copper, aluminum, ferromagnetic material or the like.

Referring to FIG. 1, the at least one induction coil 300 is located on a side of the substrate 200. An induction coil 300 includes a plurality of turns of conductive wiring 310.

In some examples, the induction coil 300 is helically disposed around its central point A and spreads out, and the induction coil 300 includes a first end 320 and a second end 330. The first end 320 is an end of the induction coil 300 proximate to the central point A, and the second end 330 is an end of the induction coil 300 away from the central point A. Therefore, a distance between the first end 320 and the central point A is less than a distance between the second end 330 and the central point A.

Referring to FIG. 1, starting from the first end 320, a portion of the induction coil 300 spreads around the central point A for a circle is a first turn of conductive wiring 310; starting from an end point of the first turn of conductive wiring 310, a portion of the induction coil 300 spreads around the central point A for a circle is a second turn of conductive wiring 310; and so forth. Thus, the plurality of turns of conductive wiring 310 may be formed.

Under an action of a driving coil, a current may be generated on the induction coil 300, and thus an induced electromotive force is formed. The induced electromotive force of the induction coil 300 is in a direct proportion to the number of turns, and the induced electromotive force of the induction coil 300 gradually increases as the number of turns increases. Therefore, different turns of a conductive wiring 310 have different induced electromotive forces.

In some examples, referring to FIG. 1, the induction coil 300 is substantially in a rectangular shape. In some other examples, the induction coil 300 may be substantially in a shape of another polygon, such as a pentagon or a hexagon; or the induction coil 300 may also be in a shape of a circle.

Figure 2:
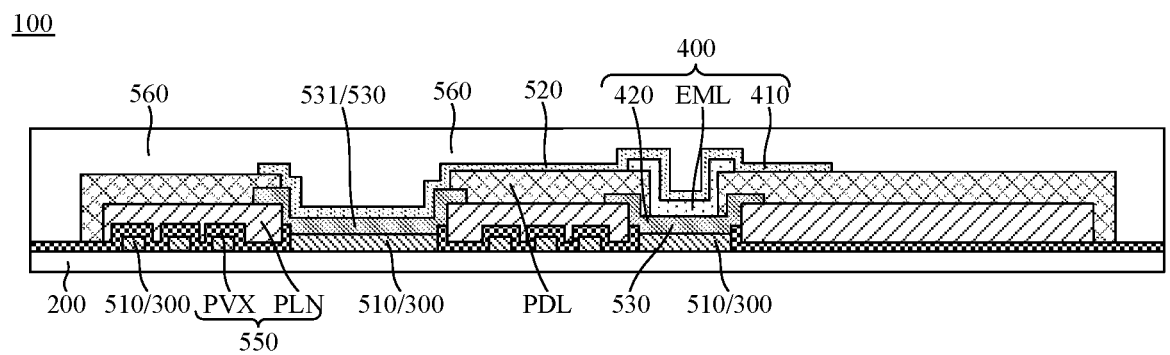
FIG. 2 is a sectional view of a light-emitting device, in accordance with some embodiments.

FIG. 2 is a sectional view of the light-emitting device 100, in accordance with some embodiments.

Referring to FIG. 2, the light-emitting device 100 includes at least one conductive layer 510, and the conductive layer(s) 510 are located on the side of the substrate 200. The induction coil(s) 300 are included in the conductive layer(s) 510. For example, an induction coil 300 may be formed by an etching process.

Referring to FIG. 1, the at least two light-emitting units 400 are located on a side of the induction coil 300 away from substrate 200. Each light-emitting unit 400 includes a first electrode 410 and a second electrode 420.

Referring to FIG. 2, the light-emitting device 100 further includes a first electrode layer 520 and a second electrode layer 530, both of which are located on a side of the conductive layer(s) 510 away from the substrate 200. The first electrode 410 is located in the first electrode layer 520, and the second electrode 420 is located in the second electrode layer 530.

In addition, the light-emitting device 100 further includes an encapsulation layer 560. The encapsulation layer 560 covers the light-emitting units 400, and is located on a side of the light-emitting units 400 away from the substrate 200. The encapsulation layer 560 may wrap the light-emitting unit 400 to avoid water vapor and oxygen in an external environment from entering the light-emitting device 100 and damaging an organic material in the light-emitting unit 400.

For example, the encapsulation layer 560 includes a first inorganic layer, an organic layer and a second inorganic layer that are sequentially stacked on the side of the light-emitting units 400 away from the substrate 200.

Figure 3:
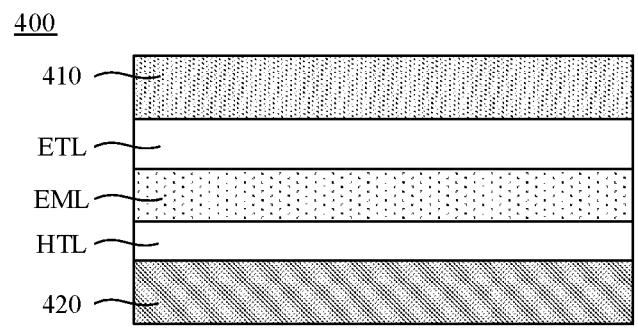
FIG. 3 is a structural diagram of a light-emitting unit in a light-emitting device, in accordance with some embodiments.

FIG. 3 is a structural diagram of the light-emitting unit 400 in the light-emitting device 100, in accordance with some embodiments.

In some embodiments, referring to FIGS. 1, 2 and 3, the light-emitting unit 400 is an organic light-emitting diode (OLED). In this case, in addition to the first electrode 410 and the second electrode 420, the light-emitting unit 400 further includes a light-emitting layer EML located between the first electrode 410 and the second electrode 420.

For example, referring to FIG. 2, the light-emitting device 100 further includes a pixel defining layer PDL, and the pixel defining layer PDL is located on a side of the second electrode layer 530 away from the substrate 200. Pixel openings are formed in the pixel defining layer PDL, and the light-emitting layer EML may be disposed in a pixel opening.

In some examples, areas of light-emitting layers EML of at least two light-emitting units 400 may be different.

In the first electrode 410 and the second electrode 420, one is an anode, and the other one is a cathode. A voltage is applied across the anode and the cathode to generate an electric field between the anode and the cathode, holes in the anode and electrons in the cathode may be driven by the electric field to be recombined in the light-emitting layer EML, so that light is emitted.

In some examples, the light-emitting layer EML of one light-emitting unit 400 may emit any one of blue light, red light, green light and white light.

In some examples, referring to FIG. 3, at least one of a hole injection layer (HIL), a hole transport layer (HTL) and an electron blocking layer (EBL) is provided between the anode and the light-emitting layer EML; at least one of an electron injection layer (EIL), an electron transport layer (ETL) and a hole blocking layer (HBL) is provided between the cathode and the light-emitting layer. Thus, the light-emitting efficiency of the OLED (light-emitting unit) is improved.

In some examples, the light-emitting layer EML of the light-emitting unit 400 may include a plurality of light-emitting portions. In this case, the plurality of light-emitting portions share the first electrode 410 and the second electrode 420.

In some examples, the first electrode 410 may be a light-transmissive electrode or a semi-transmissive electrode. For example, the first electrode 410 is made of a transparent conductive oxide material, such as indium tin oxide (ITO), indium zinc oxide (IZO).

In some examples, the second electrode 420 may be of a stacked composite structure such as transparent conductive oxide/metal/transparent conductive oxide. The transparent conductive oxide material is, for example, ITO or IZO. The metal material is, for example, gold (Au), silver (Ag), nickel (Ni), or platinum (Pt). For example, the second electrode 420 is of a structure of ITO/Ag/ITO.

Referring to FIG. 2, in some embodiments, in addition to the conductive layer(s) 510, the first electrode layer 520 and the second electrode layer 530 are located on the side of the induction coil 300 away from the substrate 200. The first electrode layer 520 is located on the side of the second electrode layer 530 away from the substrate 200.

Referring to FIG. 2, second electrodes 420 are included in the second electrode layer 530, and a second electrode 420 is electrically connected to the induction coil 300 through a via hole.

First electrodes 410 are included in the first electrode layer 520. The second electrode layer 530 further includes a bridging pattern 531. A first electrode 410 is connected to the bridging pattern 531 through a via hole, and the bridging pattern 531 is connected to the induction coil 300 through another via hole. The first electrode 410 is connected to the induction coil 300 through the bridging pattern 531, which may avoid the first electrode 410 and the induction coil 300 from being directly connected through a via hole. Since a distance between the first electrode 410 and the induction coil 300 is relatively large, in the case where the first electrode 410 and the induction coil 300 are directly connected through the via hole, the via hole will be relatively deep; the deeper the via hole, the greater the resistance. Therefore, by arranging the first electrode 410 to be connected to the induction coil 300 through the bridging pattern 531, it may be possible to avoid the via hole from being too deep, thereby avoiding an excessive resistance.

In some examples, referring to FIG. 2, insulating layer(s) 550 are provided between the induction coil 300 and the second electrode layer 530. For example, the insulating layer(s) 550 include a passivation layer PVX and a planarization layer PLN. The passivation layer PVX is located on the side of the induction coil 300 (i.e., a conductive layer 510) away from the substrate 200, and the planarization layer PLN is located on a side of the passivation layer PVX away from the induction coil 300 (i.e., the conductive layer 510).

For example, the passivation layer PVX is made of an inorganic insulating material, such as silicon nitride.

For example, the planarization layer PLN is made of an organic insulating material.

In an implementation, with continued reference to FIG. 1, first electrodes 410 of light-emitting units 400 are connected to the first end 320 of the induction coil 300, and second electrodes 420 of the light-emitting units 400 are connected to the second end 330 of the induction coil 300. Since the potential of the induction coil 300 is in the direct proportion to the number of turns, a potential of the second electrode 420 is different from a potential of the first electrode 410, and a potential difference exists between the first electrode 410 and the second electrode 420, so that the light-emitting unit 400 may be driven to emit light. Since the first electrodes 410 of the light-emitting units 400 are all connected to the first end 320, and second electrodes 420 of the light-emitting units 400 are all connected to the second end 330, a same potential difference exists between a first electrode 410 and a second electrode 420 of each light-emitting unit 400, and thus each light-emitting unit 400 has same luminance. As a result, differentiated light emission cannot be realized.

In light of this, some embodiments of the present disclosure provide another light-emitting device 100.

Figure 4:
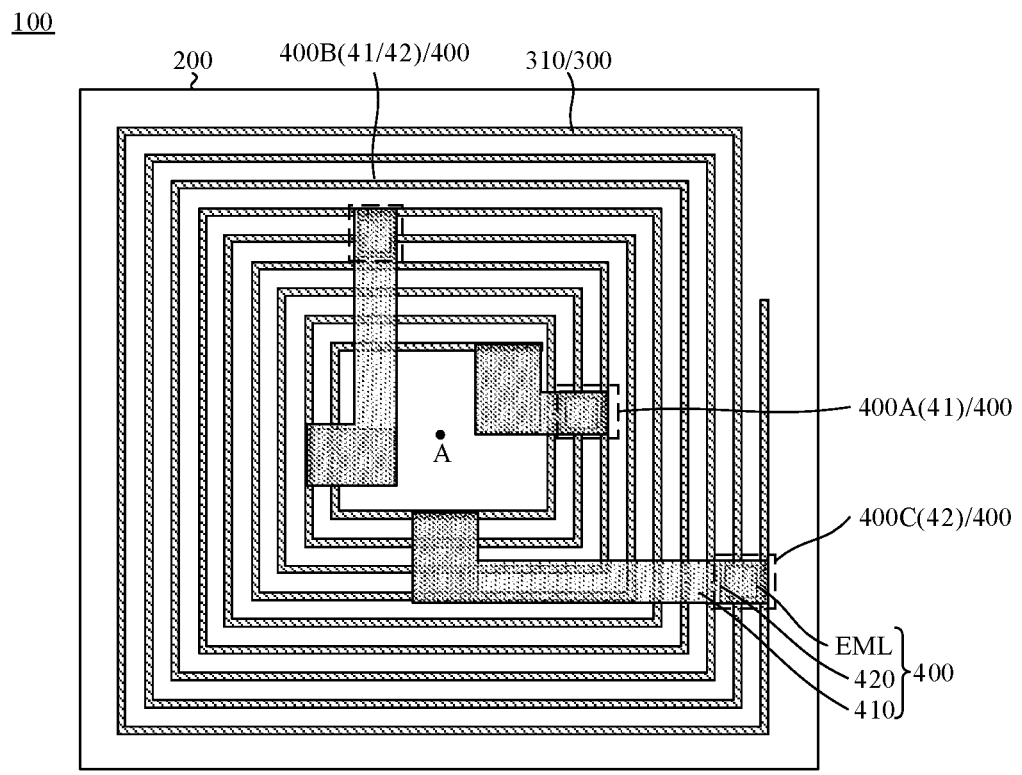
FIG. 4 is a structural diagram of a light-emitting device, in accordance with some embodiments.

FIG. 4 is a structural diagram of the another light-emitting device 100, in accordance with some embodiments.

Referring to FIG. 4, a first electrode 410 and a second electrode 420 of a same light-emitting unit 400 are electrically connected to different turns of conductive wiring 310 of a same induction coil 300. The at least two light-emitting units 400 include first-type light-emitting unit(s) 41 and second-type light-emitting unit(s) 42, an equivalent number of turns of conductive wiring 310 between a first electrode 410 and a second electrode 420 of a first-type light-emitting unit 41 is different from an equivalent number of turns of conductive wiring 310 between a first electrode 410 and a second electrode 420 of a second-type light-emitting unit 42.

Since induced potentials of different turns of conductive wiring 310 of the same induction coil 300 are different, in a case where the first electrode 410 and the second electrode 420 of the same light-emitting unit 400 are electrically connected to different turns of conductive wiring 310 of the same induction coil 300, the first electrode 410 and the second electrode 420 of the same light-emitting unit 400 may have different electromotive forces. As a result, a potential difference may be formed between the first electrode 410 and the second electrode 420, and thus the light-emitting unit 400 is ensured to emit light.

The equivalent number of turns of conductive wiring 310 between the first electrode 410 and the second electrode 420 refers to a difference between a series number of a turn of conductive wiring 310 connected to the first electrode 410 and a series number of a turn of conductive wiring 310 connected to the second electrode 420. The equivalent number of turns may be an integer greater than zero.

For the convenience of description, the equivalent number of turns of conductive wiring 310 between the first electrode 410 and the second electrode 420 of the first-type light-emitting unit 41 is simply referred to as an equivalent number of turns corresponding to the first-type light-emitting unit 41, and the equivalent number of turns of conductive wiring 310 between the first electrode 410 and the second electrode 420 of the second-type light-emitting unit 42 is simply referred to as an equivalent number of turns corresponding to the second-type light-emitting unit 42.

The equivalent number of turns corresponding to the first-type light-emitting unit 41 is different from the equivalent number of turns corresponding to the second-type light-emitting unit 42, and thus a potential difference between the first electrode 410 and the second electrode 420 of the first-type light-emitting unit 41 is different from a potential difference between the first electrode 410 and the second electrode 420 of the second-type light-emitting unit 42. Therefore, the first-type light-emitting unit 41 and the second-type light-emitting unit 42 may have different luminance.

It will be noted that, the first-type light-emitting unit 41 and the second-type light-emitting unit 42 refer to two types of light-emitting units 400 with different potential differences. The two types of light-emitting units 400 with different potential differences means that a potential difference between a first electrode 410 and a second electrode 420 of a type of light-emitting unit 400 is different from a potential difference between a first electrode 410 and a second electrode 420 of another type of light-emitting unit 400.

A plurality of light-emitting units 400 in the light-emitting device 100 may be divided into at least two types according to their corresponding equivalent number of turns. Equivalent numbers of turns corresponding to a same type of light-emitting unit 400 are the same, and equivalent numbers of turns corresponding to different types of light-emitting unit 400 are different. The number of a type of light-emitting units 400 may be one or more. At least two light-emitting units 400 in the light-emitting device 100 correspond to different equivalent numbers of turns.

In some examples, in the two types of light-emitting units 400 with different potential differences, a light-emitting unit 400 with a larger potential difference is the first-type light-emitting unit 41, and a light-emitting unit 400 with a smaller potential difference is the second-type light-emitting unit 42. In some other examples, in the two types of light-emitting units 400 with different potential differences, a light-emitting unit 400 with a smaller potential difference is the first-type light-emitting unit 41, and a light-emitting unit 400 with a larger potential difference is the second-type light-emitting unit 42.

The first-type light-emitting unit 41 and the second-type light-emitting unit 42 are illustrated below by taking an example in which the light-emitting unit 400 with the smaller potential difference in the two light-emitting units 400 with different potential differences is the first-type light-emitting unit 41, and the light-emitting unit 400 with the larger potential difference in the two light-emitting units 400 with different potential differences is the second-type light-emitting unit 42.

Referring to FIG. 4, a first light-emitting unit 400A and a second light-emitting unit 400B are included in the plurality of light-emitting units 400 in the light-emitting device 100. A first electrode 410 of the first light-emitting unit 400A is connected to the first turn of conductive wiring 310, and a second electrode 420 of the first light-emitting unit 400A is connected to a third turn of conductive wiring 310. Therefore, an equivalent number of turns corresponding to the first light-emitting unit 400A is two. It can be understood that, the equivalent number of turns corresponding to the first light-emitting unit 400A is an equivalent number of turns of conductive wiring 310 between the first electrode 410 and the second electrode 420 of the first light-emitting unit 400A.

A first electrode 410 of the second light-emitting unit 400B is connected to the second turn of conductive wiring 310, and a second electrode 420 of the second light-emitting unit 400B is connected to a seventh turn of conductive wiring 310. Therefore, an equivalent number of turns corresponding to the second light-emitting unit 400B is five. It can be understood that, the equivalent number of turns corresponding to the second light-emitting unit 400B is an equivalent number of turns of conductive wiring 310 between the first electrode 410 and the second electrode 420 of the second light-emitting unit 400B.

In summary, the equivalent number of turns corresponding to the first light-emitting unit 400A is less than the equivalent number of turns corresponding to the second light-emitting unit 400B. Therefore, the luminance of the first light-emitting unit 400A is smaller than the luminance of the second light-emitting unit 400B. In the first light-emitting unit 400A and the second light-emitting unit 400B, the first light-emitting unit 400A is the first-type light-emitting unit 41, and the second light-emitting unit 400B is the second-type light-emitting unit 42.

In addition, a third light-emitting unit 4000 may be further included in the plurality of light-emitting units 400. A first electrode 410 of the third light-emitting unit 4000 is connected to the first turn of conductive wiring 310, and a second electrode 420 of the third light-emitting unit 4000 is connected to a ninth turn of conductive wiring 310. Therefore, an equivalent number of turns corresponding to the third light-emitting unit 4000 is eight. It can be understood that, the equivalent number of turns corresponding to the third light-emitting unit 4000 is an equivalent number of turns of conductive wiring 310 between the first electrode 410 and the second electrode 420 of the third light-emitting unit 4000.

The equivalent number of turns corresponding to the second light-emitting unit 400B is five. Thus, the equivalent number of turns corresponding to the second light-emitting unit 400B is less than the equivalent number of turns corresponding to the third light-emitting unit 4000. Therefore, the luminance of the second light-emitting unit 400B is smaller than the luminance of the third light-emitting unit 4000. In the second light-emitting unit 400B and the third light-emitting unit 4000, the second light-emitting unit 400B is the first-type light-emitting unit 41, and the third light-emitting unit 4000 is the second-type light-emitting unit 42.

In some examples, the plurality of light-emitting units 400 in the light-emitting device 100 may be divided into a plurality of kinds of light-emitting units 400. The plurality of kinds of light-emitting units 400 may be arranged according to specified rules, so that the plurality of light-emitting units 400 display a specified pattern. For example, in the light-emitting devices 100, equivalent numbers of turns corresponding to the plurality of kinds of light-emitting units 400 gradually increase along a specified direction, so that brightness of the pattern displayed by the light-emitting devices 100 may have a gradual change effect. In addition, the plurality of kinds of light-emitting units 400 may be arranged according to preset rules, so that the pattern displayed by the light-emitting devices 100 has specified brightness at a specified position. As a result, the display effect of the light-emitting devices 100 is improved.

In addition, each kind of light-emitting unit 400 may include multiple light-emitting units 400, a same kind of light-emitting units 400 are arranged in a same region, and different kinds of light-emitting units 400 are located in different regions. When the light-emitting units 400 emit light, light-emitting units 400 in different regions emit light with different luminance, which enables different regions of the light-emitting device 100 to display different luminance, thereby realizing a partitioned display of the light-emitting device 100.

In summary, for the light-emitting device 100 provided in the embodiments of the present disclosure, the equivalent number of turns corresponding to the first-type light-emitting unit 41 is different from the equivalent number of turns corresponding to the second-type light-emitting unit 42, so that the first-type light-emitting unit 41 and the second-type light-emitting unit 42 have different luminance. As a result, light-emitting units 400 in the light-emitting device 100 may have different luminance, thereby realizing differentiated light emission.

Figure 5:
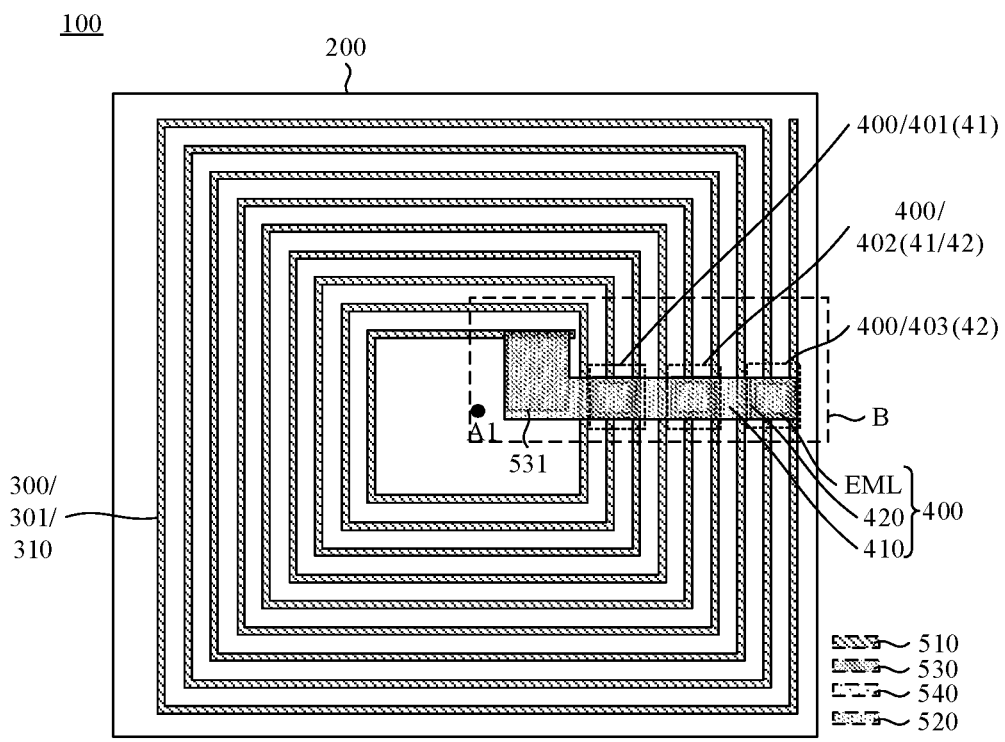
FIG. 5 is a structural diagram of a light-emitting device, in accordance with some embodiments.

FIG. 5 is a structural diagram of the light-emitting device 100, in accordance with some embodiments.

Referring to FIG. 5, in some embodiments, the at least one induction coil 300 includes first-type induction coil(s) 301. A first-type induction coil 301 is a single coil.

The first-type induction coil 301 is helically disposed around a first central point A1 thereof and spreads out. It can be understood that, the first-type induction coil 301 surrounds the first central point A1 thereof and extends along a helical direction.

Figure 6:
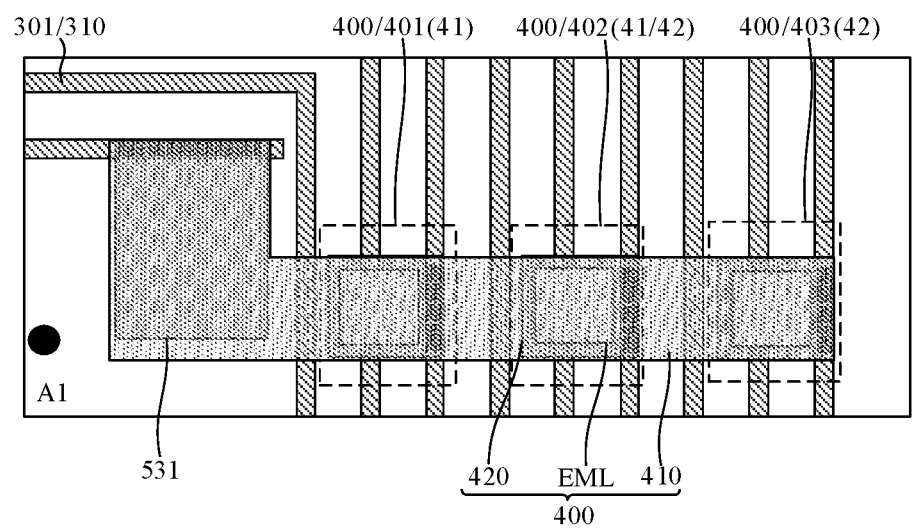
FIG. 6 is a partial enlarged view of the region B in FIG. 5.

FIG. 6 is a partial enlarged view of the region B in FIG. 5. Some embodiments of the present disclosure will be exemplarily described below in combination with FIGS. 5 and 6.

Referring to FIGS. 5 and 6, a first kind of light-emitting unit 401, a second kind of light-emitting unit 402 and a third kind of light-emitting unit 403 are included in multiple kinds of light-emitting units 400 connected to the first-type induction coil 301. It will be noted that, more or less kinds of light-emitting units 400 may also be included in the light-emitting device 100, which will not be specifically limited here.

An equivalent number of turns corresponding to the first kind of light-emitting unit 401 is two; an equivalent number of turns corresponding to the second kind of light-emitting unit 402 is five, and an equivalent number of turns corresponding to the third kind of light-emitting unit 403 is eight. The equivalent number of turns corresponding to the first kind of light-emitting unit 401, the equivalent number of turns corresponding to the second kind of light-emitting unit 402, and the equivalent number of turns corresponding to the third kind of light-emitting unit 403 gradually increase, and thus the luminance of the first kind of light-emitting unit 401, the luminance of the second kind of light-emitting unit 402 and the luminance of the third kind of light-emitting unit 403 gradually increase.

In the first kind of light-emitting unit 401 and the second kind of light-emitting unit 402, the first kind of light-emitting unit 401 is a first-type light-emitting unit 41, and the second kind of light-emitting unit 402 is a second-type light-emitting unit 42. In the second kind of light-emitting unit 402 and the third kind of light-emitting unit 403, the second kind of light-emitting unit 402 is a first-type light-emitting unit 41, and the third kind of light-emitting unit 403 is a second-type light-emitting unit 42. In the first kind of light-emitting unit 401 and the third kind of light-emitting unit 403, the first kind of light-emitting unit 401 is a first-type light-emitting unit 41, and the third kind of light-emitting unit 403 is a second-type light-emitting unit 42. Therefore, in some embodiments below, the first kind of light-emitting unit 401, the second kind of light-emitting unit 402 and the third kind of light-emitting unit 403 are included in the first-type light-emitting unit 41 and the second-type light-emitting unit 42.

In addition, in some embodiments of the present disclosure, the light-emitting units 400 are divided into the plurality of kinds according to the equivalent numbers of turns corresponding to the light-emitting units 400. As mentioned in some embodiments above, the first light-emitting unit 400A is the first kind of light-emitting unit 401, the second light-emitting unit 400B is the second kind of light-emitting unit 402, and the third light-emitting unit 4000 is the third kind of light-emitting unit 403.

Referring to FIGS. 5 and 6, the first electrode 410 of the first-type light-emitting unit 41 and the first electrode 410 of the second-type light-emitting unit 42 are electrically connected to a designated end of the first-type induction coil 301. The designated end of the first-type induction coil 301 is an end of the first-type induction coil 301 proximate to the first central point A1; or the designated end of the first-type induction coil 301 is an end of the first-type induction coil 301 away from the first central point A1. The first electrode 410 of the first-type light-emitting unit 41 and the first electrode 410 of the second-type light-emitting unit 42 are connected to a same end of the first-type induction coil 301. In this case, the first electrode 410 of the first-type light-emitting unit 41 and the first electrode 410 of the second-type light-emitting unit 42 have a same potential.

The first-type light-emitting unit 41 and the second-type light-emitting unit 42 that are connected to the first-type induction coil 301 share a first electrode 410. In this case, first electrodes 410 of the first-type light-emitting unit 41 and the second-type light-emitting unit 42 that are connected to the first-type induction coil 301 have the same potential.

The first-type light-emitting unit 41 and the second-type light-emitting unit 42 that are connected to the first-type induction coil 301 sharing the first electrode 410 can be understood as the first electrodes 410 of the first-type light-emitting unit 41 and the second-type light-emitting unit 42 that are connected to the first-type induction coil 301 being connected to each other to form an electrode pattern. An orthographic projection, on the substrate 200, of the electrode pattern formed by the first electrodes 410 that are connected may cover orthographic projections, on the substrate 200, of second electrodes 420 of all light-emitting units 400 sharing the electrode pattern, and an area of the orthographic projection of the first electrodes 410 on the substrate 200 is greater than an area of the orthographic projection of the second electrodes 420 on the substrate 200.

The second electrode 420 of the first-type light-emitting unit 41 and the second electrode 420 of the second-type light-emitting unit 42 are electrically connected to different turns of conductive wiring 310 of the first-type induction coil 301, so that the second electrode 420 of the first-type light-emitting unit 41 and the second electrode 420 of the second-type light-emitting unit 42 have different potentials. Since the first electrode 410 of the first-type light-emitting unit 41 and the first electrode 410 of the second-type light-emitting unit 42 have the same potential, a potential difference corresponding to the first-type light-emitting unit 41 and a potential difference corresponding to the second-type light-emitting unit 42 may be different. As a result, the first-type light-emitting unit 41 and the second-type light-emitting unit 42 have different luminance. The potential difference corresponding to the first-type light-emitting unit 41 refers to the potential difference between the first electrode 410 and the second electrode 420 of the first-type light-emitting unit 41; the potential difference corresponding to the second-type light-emitting unit 42 refers to the potential difference between the first electrode 410 and the second electrode 420 of the second-type light-emitting unit 42.

Multiple kinds of light-emitting units 400 are illustrated in FIGS. 5 and 6. For example, the first kind of light-emitting unit 401, the second kind of light-emitting unit 402 and the third kind of light-emitting unit 403 are illustrated. Since first electrodes 410 of all light-emitting units 400 are connected to the end of the first-type induction coil 301 proximate to the first central point A1, the first electrodes 410 of the multiple kinds of light-emitting units 400 have the same potential.

A second electrode 420 of the first kind of light-emitting unit 401, a second electrode 420 of the second kind of light-emitting unit 402 and a second electrode 420 of the third kind of light-emitting unit 403 are each connected to a different turn of conductive wiring, and are gradually away from the end of the first-type induction coil 301 proximate to the first central point A1. Thus, the equivalent number of turns corresponding to the first kind of light-emitting unit 401, the equivalent number of turns corresponding to the second kind of light-emitting unit 402 and the equivalent number of turns corresponding to the third kind of light-emitting unit 403 gradually increase.

For example, the first kind of light-emitting unit 401, the second kind of light-emitting unit 402, and the third kind of light-emitting unit 403 are all connected to the end of the first-type induction coil 301 proximate to the first central point A1. That is, the first kind of light-emitting unit 401, the second kind of light-emitting unit 402 and the third kind of light-emitting unit 403 are all connected to the first turn of conductive wiring 310. The first kind of light-emitting unit 401, the second kind of light-emitting unit 402 and the third kind of light-emitting unit 403 are connected to a third turn of conductive wiring, a sixth turn of conductive wiring and a ninth turn of conductive wiring of the first-type induction coil 301, respectively. Therefore, the equivalent number of turns corresponding to the first kind of light-emitting unit 401, the equivalent number of turns corresponding to the second kind of light-emitting unit 402 and the equivalent number of turns corresponding to the third kind of light-emitting unit 403 are two, five, and eight, respectively. In some examples, the light-emitting device 100 may include only one first-type induction coil 301.

A plurality of film layers in the light-emitting device 100 will be exemplarily described below by taking one first-type induction coil 301 in the light-emitting device 100 as an example.

Figure 7:
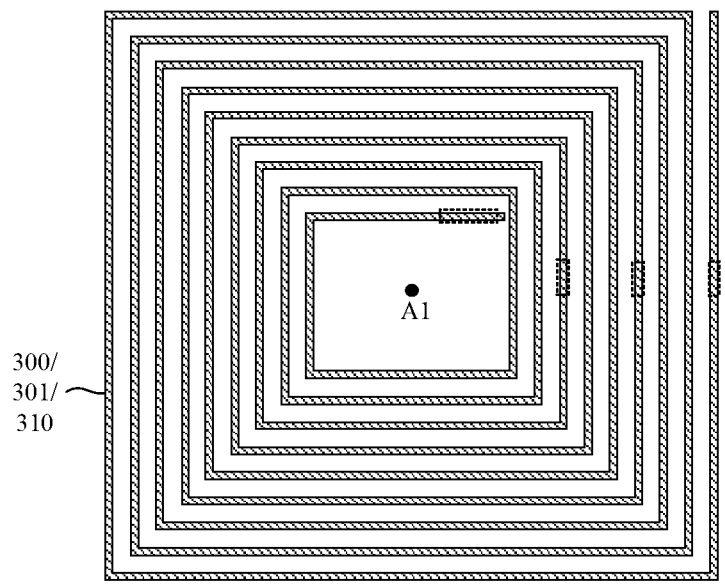
FIG. 7 is a structural diagram of a conductive layer of a light-emitting device, in accordance with some embodiments.

FIG. 7 is a structural diagram of the conductive layer 510 of the light-emitting device 100, in accordance with some embodiments.

Referring to FIG. 7, the conductive layer 510 is formed on the side of the substrate 200, and the first-type induction coil 301 is included in the conductive layer 510. The first-type induction coil 301 may be formed by an etching process. The substrate 200 is not shown in FIG. 7, but may refer to FIG. 5.

Figure 8:
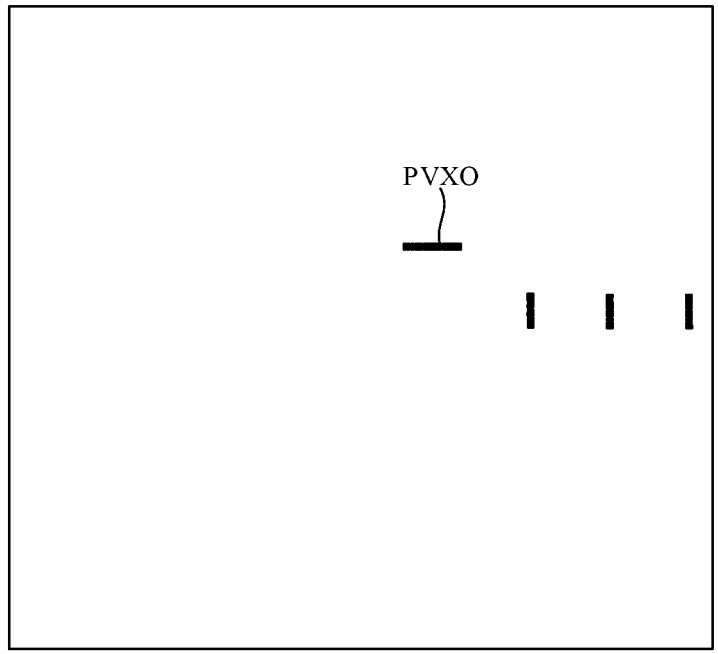
FIG. 8 is a structural diagram of a passivation layer of a light-emitting device, in accordance with some embodiments.
Figure 9:
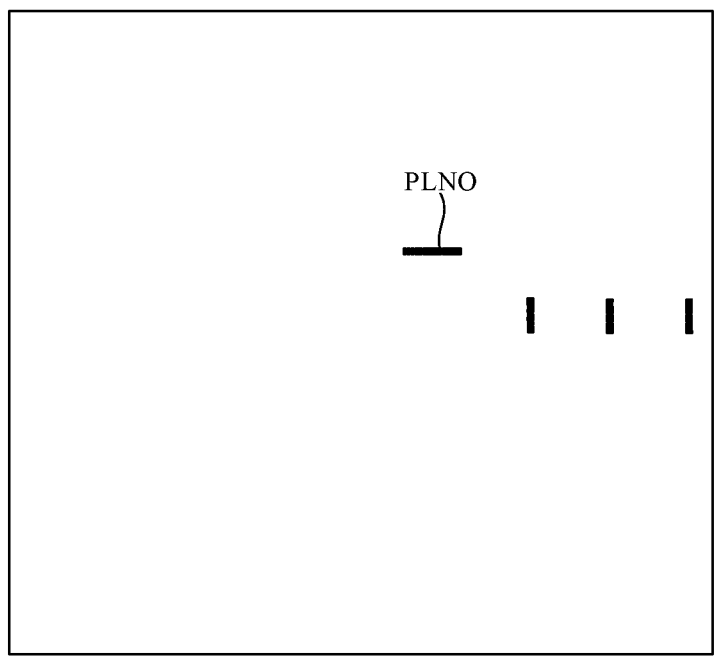
FIG. 9 is a structural diagram of a planarization layer of a light-emitting device, in accordance with some embodiments.

FIG. 8 is a structural diagram of the passivation layer PVX of the light-emitting device 100, in accordance with some embodiments; FIG. 9 is a structural diagram of the planarization layer PLN of the light-emitting device 100, in accordance with some embodiments.

Referring to FIGS. 8 and 9, after the first-type induction coil 301 is formed, the passivation layer PVX and the planarization layer PLN may be sequentially formed on a side of the first-type induction coil 301 away from the substrate 200. The first-type induction coil 301 is not shown in FIGS. 8 and 9, but may refer to FIG. 5.

Then, via holes are formed in the passivation layer PVX and the planarization layer PLN. For the convenience of distinction, via holes formed in the passivation layer PVX are marked as PVXO, and via holes formed in the planarization layer PLN are marked as PLNO. Projections of the via holes PVXO in a direction perpendicular to the substrate 200 (i.e., in a thickness direction of the substrate 200) fall in small dashed boxes in FIG. 7.

Figure 10:
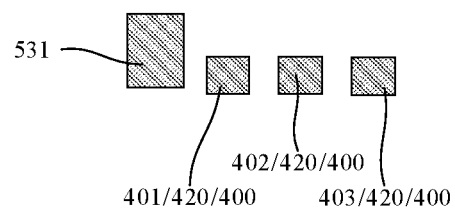
FIG. 10 is a structural diagram of a second electrode layer of a light-emitting device, in accordance with some embodiments.

FIG. 10 is a structural diagram of the second electrode layer 530 of the light-emitting device 100, in accordance with some embodiments.

The second electrode layer 530 is located on a side of the planarization layer PLN away from the substrate 200 (as shown in FIG. 5).

Referring to FIG. 10, the second electrode layer 530 includes a bridging pattern 531 and second electrodes 420 of the plurality of light-emitting units 400. The second electrodes 420 and the bridging pattern 531 are each connected to the first-type induction coil 301 (as shown in FIG. 5) through a via hole PLNO (as shown in FIG. 9) and a via hole PVXO (as shown in FIG. 8).

For example, referring to FIG. 5, the bridging pattern 531 is connected to the end of the first-type induction coil 301 proximate to the first central point A1 through a via hole. In this case, the designated end of the first-type induction coil 301 is the end of the first-type induction coil 301 proximate to the first central point A1.

For example, the second electrodes 420 of the plurality of light-emitting units 400 are each connected to a different turn of conductive wiring 310 (as shown in FIG. 5) through a via hole, so that the plurality of light-emitting units 400 have different potential differences. As a result, the plurality of light-emitting units 400 have different luminance. A potential difference that the light-emitting unit 400 has refers to the potential difference between the first electrode 410 and the second electrode 420 of the light-emitting unit 400.

Figure 11:
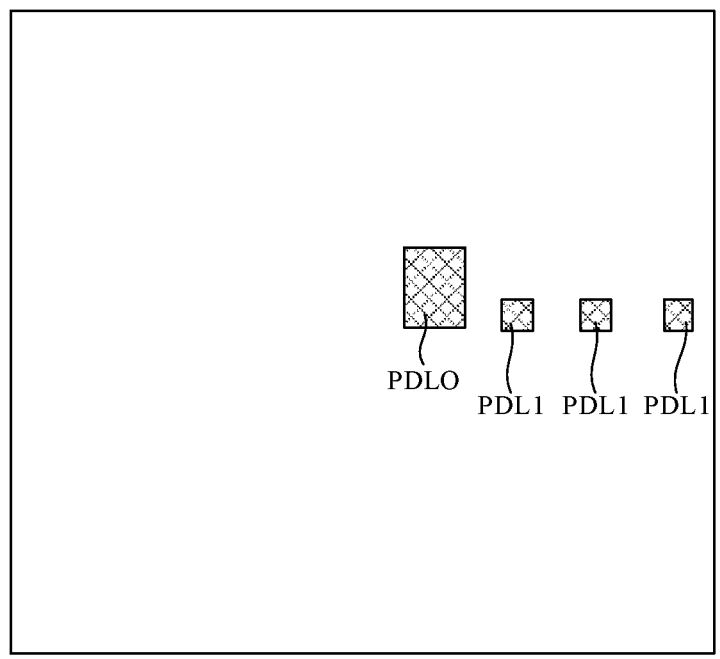
FIG. 11 is a structural diagram of a pixel defining layer of a light-emitting device, in accordance with some embodiments.

FIG. 11 is a structural diagram of the pixel defining layer PDL of the light-emitting device 100, in accordance with some embodiments.

The pixel defining layer PDL is formed after the second electrode layer 530 is formed.

Referring to FIG. 11, a plurality of pixel openings PDL1 are formed in the pixel defining layer PDL. In addition to the pixel openings PDL1, the pixel defining layer PDL further includes a via hole. For convenience of distinction, the via hole in the pixel defining layer PDL may be marked as PDLO.

In some examples, areas of at least two pixel openings PDL1 may be different, so that the at least two pixel openings PDL1 may be suitable for light-emitting layers EML with different areas.

Figure 12:
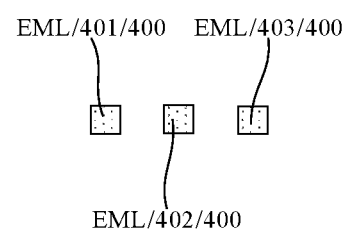
FIG. 12 is a structural diagram of a light-emitting film layer of a light-emitting device, in accordance with some embodiments.

FIG. 12 is a structural diagram of a light-emitting film layer 540 of the light-emitting device 100, in accordance with some embodiments.

Light-emitting layers EML are formed after the pixel defining layer PDL is formed.

Referring to FIG. 12, the light-emitting film layer 540 includes a plurality of light-emitting layers EML, and a light-emitting layer EML is located in a pixel opening PDL1 (refer to FIG. 11).

Figure 13:
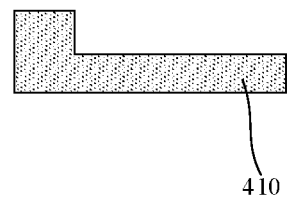
FIG. 13 is a structural diagram of a first electrode layer of a light-emitting device, in accordance with some embodiments.

FIG. 13 is a structural diagram of the first electrode layer 520 of the light-emitting device 100, in accordance with some embodiments.

The first electrode layer 520 is formed after the light-emitting layers EML are formed.

Referring to FIG. 13, the first electrode 410 is included in the first electrode layer 520. The first electrode 410 of the first electrode layer 520 may be connected to the bridging pattern 531 (which may refer to FIG. 10) through the via hole PDLO (which may refer to FIG. 11).

Figure 14:
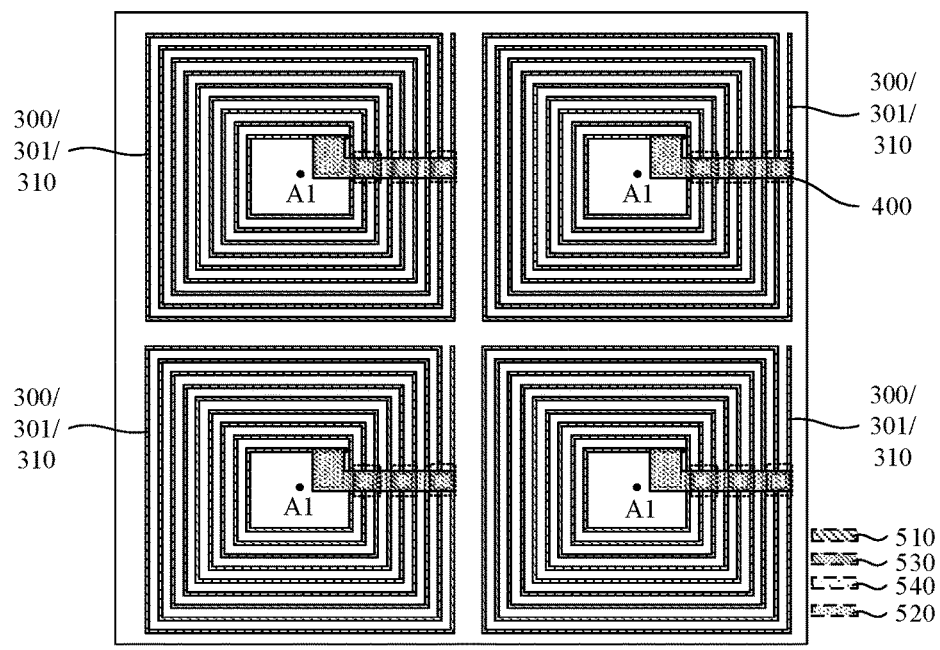
FIG. 14 is a structural diagram of a light-emitting device, in accordance with some embodiments.

The embodiments in which one first-type induction coil 301 may be included in the light-emitting device 100 are described above. FIG. 14 is a structural diagram of the light-emitting device 100, in accordance with some other embodiments. Referring to FIG. 14, in some other embodiments, a plurality of first-type induction coils 301 are provided, and the plurality of first-type induction coils 301 are insulated from each other.

In the case where the plurality of first-type induction coils 301 are provided in the light-emitting device 100, and a driving coil approaches any one first-type induction coil 301, light-emitting units 400 connected to the first-type induction coil 301 may emit light.

In some examples, the plurality of first-type induction coils 301 have the same inner diameter, the same outer diameter and the same number of turns.

Referring to FIG. 14, in some embodiments, multiple first-type induction coils 301 may be arranged side by side on the side of the substrate 200. The plurality of first-type induction coils 301 may be located in a same conductive layer 510. Of course, the plurality of first-type induction coils 301 may also be arranged in at least two conductive layers 510.

At least one first-type induction coil 301 is connected to multiple kinds of light-emitting units 400.

Figure 15:
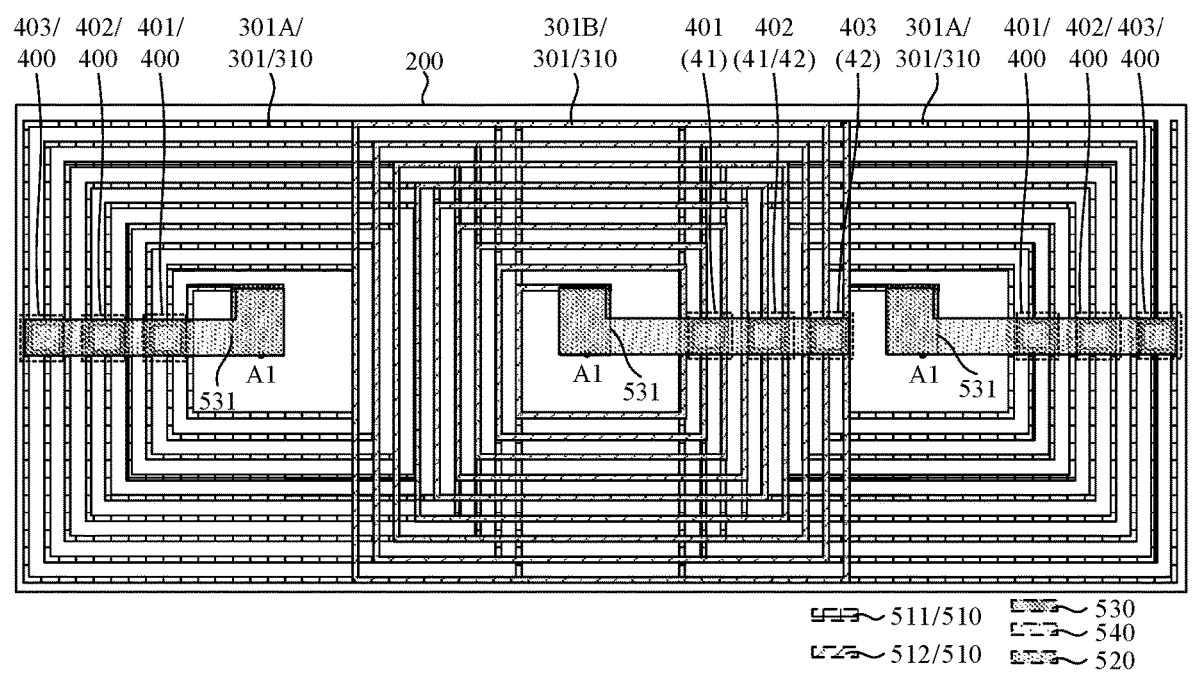
FIG. 15 is a structural diagram of a light-emitting device, in accordance with some embodiments.

FIG. 15 is a structural diagram of the light-emitting device 100, in accordance with some other embodiments.

Referring to FIG. 15, in some other embodiments, regions surrounded by outermost turns of conductive wirings 310 of at least two first-type induction coils 301 are partially overlapped in the direction perpendicular to the substrate 200.

As shown in FIG. 15, the first-type induction coil 301 includes nine turns of conductive wiring, and a ninth turn of conductive wiring is the outermost turn of conductive wiring 310 of the first-type induction coil 301.

A region surrounded by the outermost turn of conductive wiring 310 of the first-type induction coil 301 is a region where the first-type induction coil 301 is located, and the region where the first-type induction coil 301 is located includes a region where the conductive wiring 310 is located and intervals, each interval being a region between adjacent turns of the conductive wiring 310.

Since the regions where at least two first-type induction coils 301 are located are partially overlapped in the direction perpendicular to the substrate 200, an area occupied by orthographic projections of the plurality of first-type induction coils 301 on the substrate 200 may be reduced. As a result, an area of the light-emitting device 100 is reduced.

In some examples, conductive wirings 310 of at least two first-type induction coils 301 are partially overlapped.

In some examples, an orthographic projection, on the substrate 200, of an end of any one of the first-type induction coils 301 proximate to a first central point A1 thereof does not overlap with an orthographic projection, on the substrate 200, of a conductive wiring 310 of any other of the first-type induction coils 301.

Referring to FIG. 15, in some examples, each first-type induction coil 301 is electrically connected to multiple kinds of light-emitting units 400. For example, each first-type induction coil 301 is electrically connected to a first kind of light-emitting unit 401, a second kind of light-emitting unit 402 and a third kind of light-emitting unit 403. Of course, the light-emitting units 403 electrically connected to each first-type induction coil 301 may also correspond to different equivalent numbers of turns.

For example, the number of first-type induction coils 301 may be two, three or even more.

For example, in a case where the number of first-type induction coils 301 is three, the three first-type induction coils 301 are arranged in two conductive layers 510.

For example, referring to FIG. 15, the three first-type induction coils 301 are two first-type induction coils 301A and one first-type induction coil 301B. The light-emitting device 100 includes two conductive layers 510, and the two conductive layers 510 are a first conductive layer 511 and a second conductive layer 512. The two first-type induction coils 301A are located in the first conductive layer 511, and the first-type induction coil 301B is located in the second conductive layer 512.

In some examples, multiple kinds of light-emitting units 400 connected to one first-type induction coil 301A are sequentially away from the first-type induction coil 301B.

The plurality of film layers in the light-emitting device 100 will be described below by taking an example in which the number of the first-type induction coils 301 is three.

Figure 16:
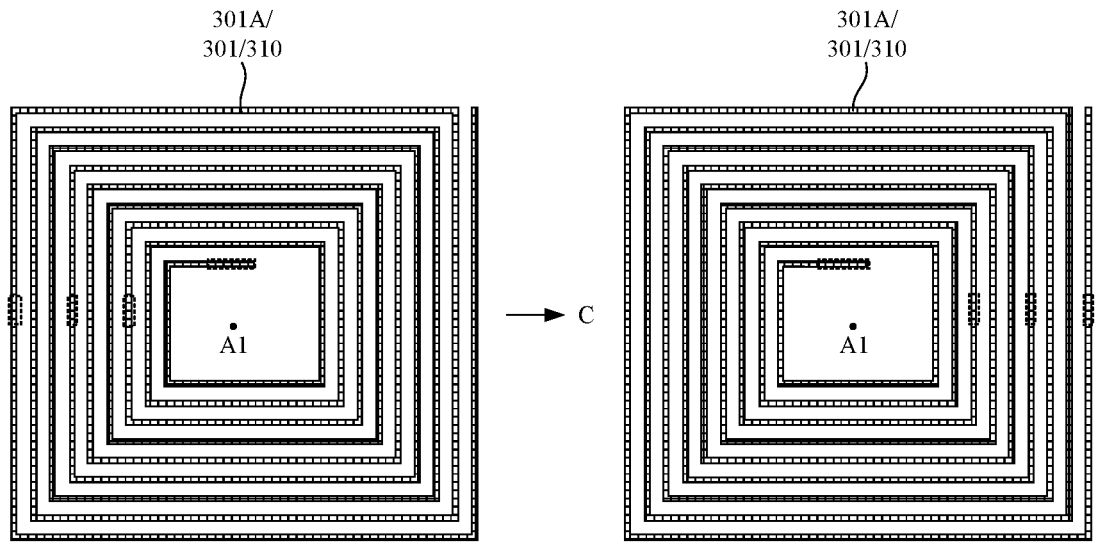
FIG. 16 is a structural diagram of a first conductive layer of a light-emitting device, in accordance with some embodiments.

FIG. 16 is a structural diagram of the first conductive layer 511 of the light-emitting device 100, in accordance with some embodiments.

The first conductive layer 511 is located on the side of the substrate 200.

Referring to FIG. 16, the two first-type induction coils 301A located in the first conductive layer 511 are sequentially arranged in a first direction C, and an interval is provided therebetween. The direction indicated by the arrow C is the first direction. The first direction C is parallel to the substrate 200 (that is, the first direction C is perpendicular to the thickness direction of the substrate 200).

Figure 17:
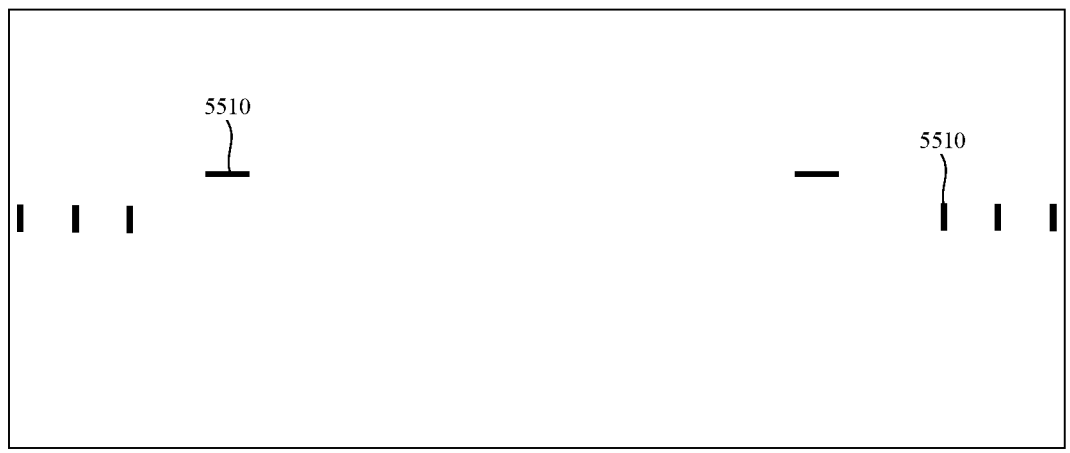
FIG. 17 is a structural diagram of a first insulating layer of a light-emitting device, in accordance with some embodiments.

FIG. 17 is a structural diagram of a first insulating layer 551 of the light-emitting device 100, in accordance with some embodiments.

The first insulating layer 551 is located on a side of the first conductive layer 511 away from the substrate 200.

Referring to FIG. 17, via hole 5510 are formed in the insulating layer 551.

The first insulating layer 551 includes a passivation layer PVX and a planarization layer PLN. It can be understood that, the via hole 5510 penetrates both the passivation layer PVX and the planarization layer PLN of the first insulating layer 551.

Referring to FIG. 16, orthographic projections of the via holes 5510 in the direction perpendicular to the substrate 200 fall in dashed boxes in FIG. 16.

Figure 18:
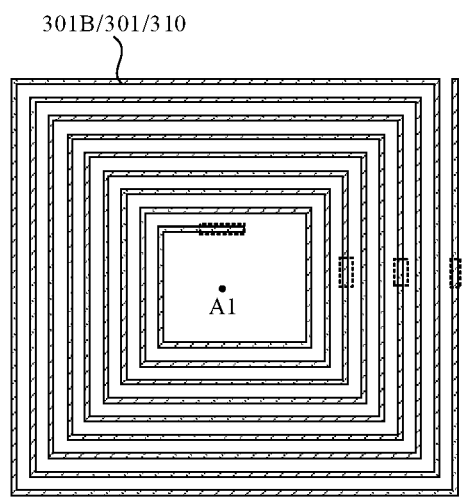
FIG. 18 is a structural diagram of a second conductive layer of a light-emitting device, in accordance with some embodiments.

FIG. 18 is a structural diagram of the second conductive layer 512 of the light-emitting device 100, in accordance with some embodiments.

The second conductive layer 512 is located on a side of the first insulating layer 551 away from the substrate 200.

Referring to FIG. 18, the first-type induction coil 301B located in the second conductive layer 512 covers the interval between the two first-type induction coils 301A located in the first conductive layer 511. The two first-type induction coils 301A in the first conductive layer 511 are not shown in FIG. 18, but may refer to FIG. 15.

In some examples, referring to FIG. 15, a region where the first-type induction coil 301B is located overlaps with a region where each of the two first-type induction coils 301A is located.

Figure 19:
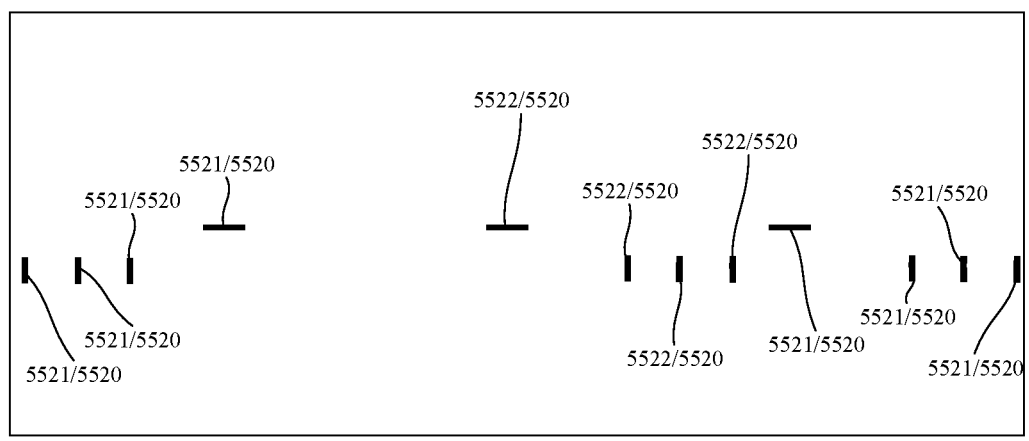
FIG. 19 is a structural diagram of a second insulating layer of a light-emitting device, in accordance with some embodiments.

FIG. 19 is a structural diagram of the second insulating layer 552 of the light-emitting device 100, in accordance with some embodiments.

The second insulating layer 552 is located on a side of the second conductive layer 512 away from the substrate 200.

Referring to FIG. 19, via holes 5520 are formed in the second insulating layer 552. Referring to FIGS. 16 and 18, orthographic projections of the via holes 5520 in the direction perpendicular to the substrate 200 fall in dashed boxes shown in FIGS. 16 and 18.

The second insulating layer 552 includes a passivation layer PVX and a planarization layer PLN.

Figure 20:
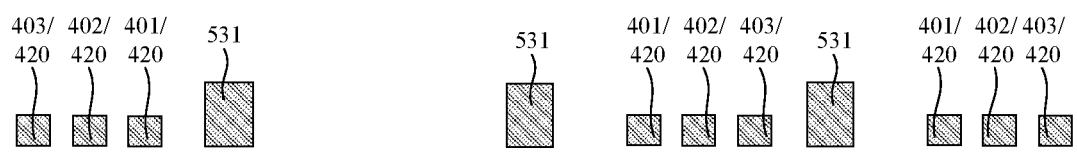
FIG. 20 is a structural diagram of a second electrode layer of a light-emitting device, in accordance with some embodiments.

FIG. 20 is a structural diagram of the second electrode layer 530 of the light-emitting device 100, in accordance with some embodiments.

The second electrode layer 530 is located on a side of the second insulating layer 552 away from the substrate 200.

Referring to FIG. 20, the second electrode layer 530 includes a plurality of bridging patterns 531 and a plurality of second electrodes 420. In some examples, the multiple kinds of light-emitting units 400 connected to one first-type induction coil 301A are sequentially away from the first-type induction coil 301B. It can be understood that, second electrodes 420 of the multiple kinds of light-emitting units 400 are sequentially away from the first-type induction coil 301B. The first-type induction coil 301A and the first-type induction coil 301B are not shown in FIG. 20, but may refer to FIG. 15.

Figure 21:
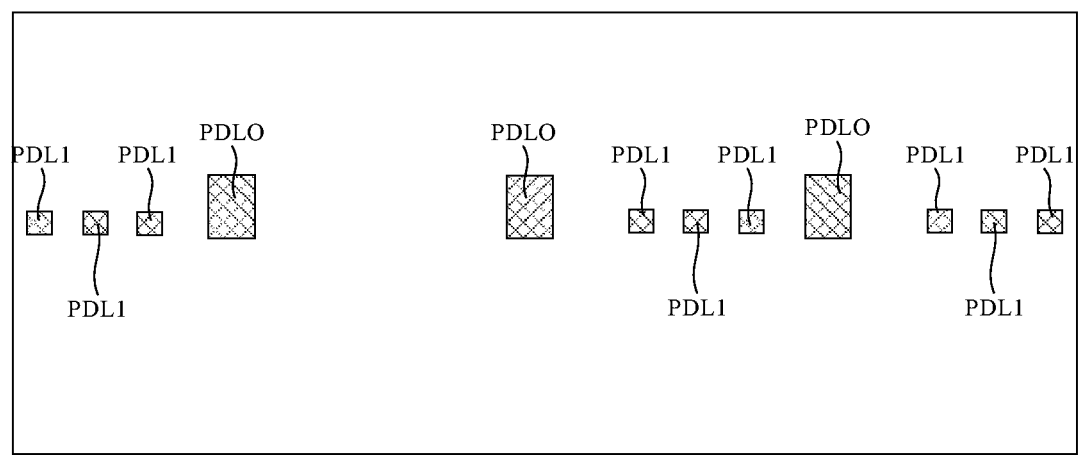
FIG. 21 is a structural diagram of a pixel defining layer of a light-emitting device, in accordance with some embodiments.

FIG. 21 is a structural diagram of the pixel defining layer PDL of the light-emitting device 100, in accordance with some embodiments.

Referring to FIG. 21, via holes PDLO are provided at positions of the pixel defining layer PDL corresponding to the bridging patterns 531. In addition to the via holes PDLO, the pixel defining layer PDL further includes pixel openings PDL1.

Figure 22:
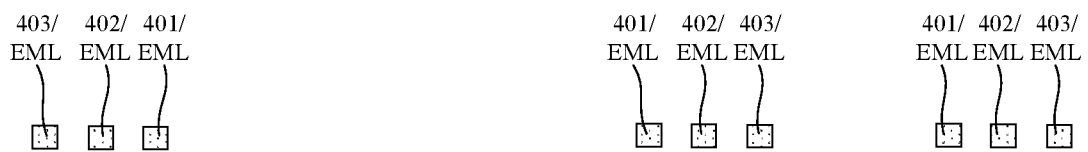
FIG. 22 is a structural diagram of a light-emitting film layer of a light-emitting device, in accordance with some embodiments.

FIG. 22 is a structural diagram of the light-emitting film layer 540 of the light-emitting device 100, in accordance with some embodiments.

Referring to FIG. 22, the light-emitting film layer 540 includes the plurality of light-emitting layers EML, and a light-emitting layer EML is located in a pixel opening PDL1, so that the second electrode 420 is under the light-emitting layer EML.

Figure 23:
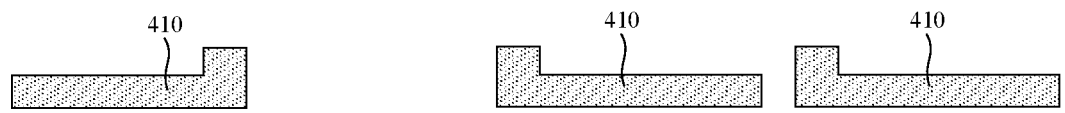
FIG. 23 is a structural diagram of a first electrode layer of a light-emitting device, in accordance with some embodiments.

FIG. 23 is a structural diagram of the first electrode layer 520 of the light-emitting device 100, in accordance with some embodiments.

Referring to FIG. 23, the first electrode layer 520 includes first electrodes 410. First electrodes 410 of the multiple kinds of light-emitting units 400 connected to one first-type induction coil 301 are connected to each other, and first electrodes 410 of multiple kinds of light-emitting units 400 connected to different first-type induction coils 301 are insulated from each other.

The first electrodes 410 of the multiple kinds of light-emitting units 400 disposed on one first-type induction coil 301 are electrically connected to the first-type induction coil 301 through a bridging pattern 531. The bridging pattern 531 and the first-type induction coil 301 are not shown in FIG. 23, but may refer to FIG. 15.

The embodiments in which one or more first-type induction coils 301 are included in the light-emitting device 100 are described above. In some other embodiments, second-type induction coil(s) may also be included in the light-emitting device 100.

Figure 24:
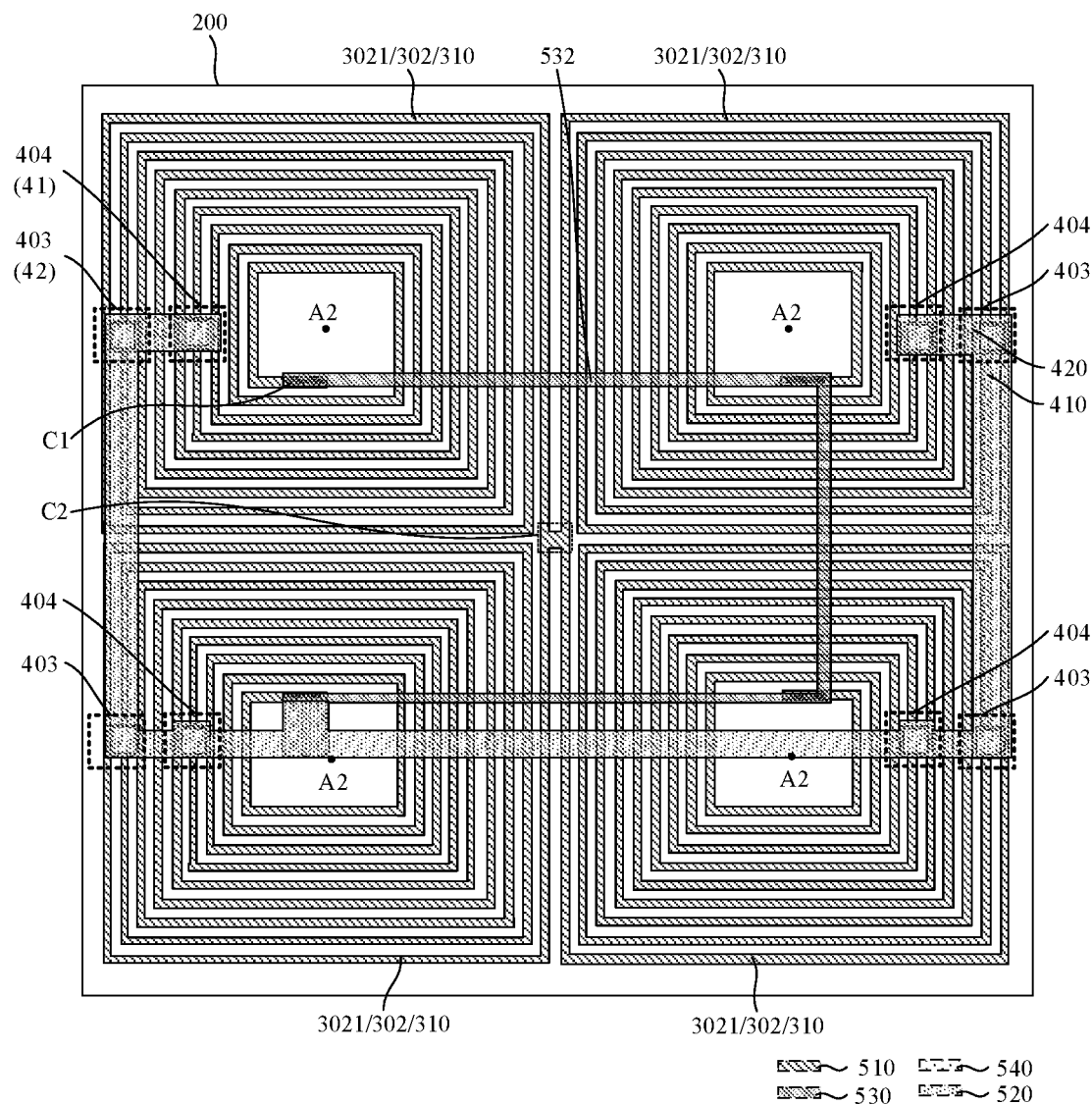
FIG. 24 is a structural diagram of a light-emitting device, in accordance with some embodiments.

FIG. 24 is a structural diagram of the light-emitting device 100, in accordance with some embodiments.

Referring to FIG. 24, in some embodiments, the at least one induction coil 300 includes the second-type induction coil(s) 302. A second-type induction coil 302 includes a plurality of sub-coils 3021, and each sub-coil 3021 is helically disposed around a respective second central point A2 and spreads out. Each sub-coil 3021 includes multiple turns of conductive wiring 310.

An end of each sub-coil 3021 proximate to a respective second central point A2 surrounded thereby is electrically connected to one another to form a first connection end C1, and an end of each sub-coil 3021 away from the respective second central point A2 surrounded thereby is electrically connected to one another to form a second connection end C2.

Since the end of each sub-coil 3021 proximate to the respective second central point A2 surrounded thereby is electrically connected to one another, the end of each sub-coil 3021 proximate to the respective second central point A2 surrounded thereby has a same potential.

Since the end of each sub-coil 3021 away from the respective second central point A2 surrounded thereby is electrically connected to one another, the end of each sub-coil 3021 away from the respective second central point A2 surrounded thereby has a same potential.

The end of each sub-coil 3021 proximate to the respective second central point A2 surrounded thereby is electrically connected to one another, and the end of each sub-coil 3021 away from the respective second central point A2 surrounded thereby is electrically connected to one another, so that the plurality of sub-coils 3021 may be connected in parallel. After the sub-coils 3021 are connected in parallel, the resistance thereof decreases and the inductance thereof increases. As a result, the induced potential of the induction coil 300 is increased, and thus the luminance of the light-emitting unit 400 is increased.

Referring to FIG. 24, two kinds of light-emitting units 400 are shown in FIG. 24, and one of the two kinds of light-emitting units 400 is the third kind of light-emitting unit 403. It can be seen from the above that the equivalent number of turns corresponding to the third kind of light-emitting unit 403 is eight. The other one light-emitting unit 400 in the two kinds of light-emitting units 400 is a fourth kind of light-emitting unit 404. An equivalent number of turns corresponding to the fourth kind of light-emitting unit 404 is four. It will be noted that, the two kinds of light-emitting units 400 shown in FIG. 24 are merely taken as an example for illustration in some embodiments of the present disclosure, and do not limit the type and quantity of light-emitting units 400 in the light-emitting device 100 in the embodiments of the present disclosure. That is, in some embodiments above, one second-type induction coil 302 may be connected to more kinds of light-emitting units 404.

Thus, the equivalent number of turns corresponding to the fourth kind of light-emitting unit 404 is less than the equivalent number of turns corresponding to the third kind of light-emitting unit 403. Therefore, in the fourth kind of light-emitting unit 404 and the third kind of light-emitting unit 403, the fourth kind of light-emitting unit 404 is the first-type light-emitting unit 41, and the third kind of light-emitting unit 403 is the second-type light-emitting unit 42.

For example, in a case the second-type induction coil 302 is further connected to the first kind of light-emitting unit, in the first kind of light-emitting unit and the fourth kind of light-emitting unit 404, the first kind of light-emitting unit is the first-type light-emitting unit 41, and the fourth kind of light-emitting unit 404 is the second-type light-emitting unit 42.

In a case where the second-type induction coil 302 is further connected to a fifth kind of light-emitting unit, and an equivalent number of turns corresponding to the fifth kind of light-emitting unit is twelve, since the equivalent number of turns corresponding to the third kind of light-emitting unit 403 is eight, in the fifth kind of light-emitting unit and the third kind of light-emitting unit 403, the third kind of light-emitting unit 403 is the first-type light-emitting unit 41, and the fifth kind of light-emitting unit is the second-type light-emitting unit 42.

In some embodiments below, the third kind of light-emitting unit 403 and the fourth kind of light-emitting unit 404 are included in the first-type light-emitting unit 41 and the second-type light-emitting unit 42. In some embodiments, the first electrode 410 of the first-type light-emitting unit 41 and the first electrode 410 of the second-type light-emitting unit 42 are electrically connected to a designated end of the second-type induction coil 302. Therefore, the first electrode 410 of the first-type light-emitting unit 41 and the first electrode 410 of the second-type light-emitting unit 42 have a same potential. The designated end of the second-type induction coil 302 is the first connection end or the second connection end.

For example, referring to FIG. 24, first electrodes 410 of the third kind of light-emitting unit 403 and the fourth kind of light-emitting unit 404 are both connected to the first connection end, and thus have the same potential.

Referring to FIG. 24, the second electrode 420 of the first-type light-emitting unit 41 and the second electrode 420 of the second-type light-emitting unit 42 are electrically connected to different turns of conductive wiring 310 of the second-type induction coil 302.

It will be noted that, a first turn of conductive wiring 310 of each sub-coil 3021 serves as a first turn of conductive wiring 310 of a second-type induction coil 302 to which the sub-coil 3021 belongs; a second turn of conductive wiring 310 of each sub-coil 3021 serves as a second turn of conductive wiring 310 of the second-type induction coil 302 to which the sub-coil 3021 belongs, . . . , an N-th turn of conductive wiring 310 of each sub-coil 3021 serves as an N-th turn of conductive wiring 310 of the second-type induction coil 302 to which the sub-coil 3021 belongs, and N is a positive integer. Second electrodes 420 of two light-emitting units 400 are connected to N-th turns of conductive wirings 310 of different sub-coils 3021 in the second-type induction coil 302, which means that, the second electrodes 420 of the two light-emitting units 400 are both connected to the N-th turn of conductive wiring 310 of the second-type induction coil 302. In this case, the second electrodes 420 of the two light-emitting units 400 have the same potential.

In this case, a difference between a series number of a turn of conductive wiring of the second-type induction coil 302 connected to the first electrode 410 and a series number of a turn of conductive wiring of the second-type induction coil 302 connected to the second electrode 420 is the equivalent number of turns.

The second electrode 420 of the first-type light-emitting unit 41 and the second electrode 420 of the second-type light-emitting unit 42 are electrically connected to different turns of conductive wiring 310 of the second-type induction coil 302, which means that, the second electrode 420 of the first-type light-emitting unit 41 and the second electrode 420 of the second-type light-emitting unit 42 are connected to different turns of conductive wiring 310 of a same sub-coil 3021 in the same second-type induction coil 302; or the second electrode 420 of the first-type light-emitting unit 41 and the second electrode 420 of the second-type light-emitting unit 42 are connected to different turns of conductive wirings 310 of different sub-coils 3021 in the same second-type induction coil 302. Therefore, the second electrode 420 of the first-type light-emitting unit 41 and the second electrode 420 of the second-type light-emitting unit 42 have different potentials.

In some embodiments above, since the first electrode 410 of the first-type light-emitting unit 41 and the first electrode 410 of the second-type light-emitting unit 42 are both connected to the designated end, the first electrode 410 of the first-type light-emitting unit 41 and the first electrode 410 of the second-type light-emitting unit 42 are connected to a same turn of conductive wiring 310 of the second-type induction coil 302. As a result, the equivalent number of turns corresponding to the first-type light-emitting unit 41 is different from the equivalent number of turns corresponding to the second-type light-emitting unit 42. Therefore, the first-type light-emitting unit 41 and the second-type light-emitting unit 42 may correspond to different potential differences, and thus have different luminance.

In some embodiments, a plurality of first-type light-emitting units 41 are provided. Second electrodes 420 of the plurality of first-type light-emitting units 41 are electrically connected to conductive wirings 310 of sub-coils 3021, and the conductive wirings 310 are in a same turn. It means that the second electrodes 420 of the plurality of first-type light-emitting units 41 are connected to a same turn of conductive wiring 310 of the second-type induction coil 302. Therefore, the second electrodes 420 of the plurality of first-type light-emitting units 41 have the same potential.

In some examples, second electrodes 420 of some first-type light-emitting units 41 may be connected to a same turn of conductive wiring 310 of a same sub-coil 3021.

For example, a plurality of fourth kind of light-emitting units 404 are provided, and the plurality of fourth kind of light-emitting units 404 are connected to fifth turns of conductive wirings of the plurality of sub-coils 3021. Therefore, second electrodes 420 of the plurality of fourth kind of light-emitting units 404 are connected to the fifth turns of conductive wirings of the second-type induction coil 302. It can be seen from the above that the first electrode 410 of the fourth kind of light-emitting unit 404 is connected to the first connection end. In this case, the equivalent number of turns corresponding to the fourth kind of light-emitting unit 404 is four.

In some embodiments, a plurality of second-type light-emitting units 42 are provided. Second electrodes 420 of the plurality of second-type light-emitting units 42 are electrically connected to conductive wirings 310 of sub-coils 3021, and the conductive wirings are in a same turn. It means that, the second electrodes 420 of the plurality of second-type light-emitting units 42 are connected to a same turn of conductive wiring 310 of the second-type induction coil 302. Therefore, the second electrodes 420 of the plurality of second-type light-emitting units 42 have the same potential.

In some examples, second electrodes 420 of some second-type light-emitting units 42 may be connected to a same turn of conductive wiring 310 of a same sub-coil 3021.

For example, a plurality of third kind of light-emitting units 403 are provided, and second electrodes 420 of the plurality of third kind of light-emitting units 403 are connected to ninth turn of conductive wirings of the plurality of sub-coils 3021. Therefore, the second electrodes 420 of the plurality of third kind of light-emitting units 403 are connected to a ninth turn of conductive wiring of the second-type induction coil 302. It can be seen from the above that the first electrode 410 of the third kind of light-emitting unit 403 is connected to the first connection end. In this case, the equivalent number of turns corresponding to the third kind of light-emitting unit 403 is eight.

Some implementations are described below in which the end of each sub-coil 3021 proximate to the respective second central point A2 surrounded thereby is electrically connected to one another, and the end of each sub-coil 3021 away from the respective second central point A2 surrounded thereby is electrically connected to one another.

Figure 42:
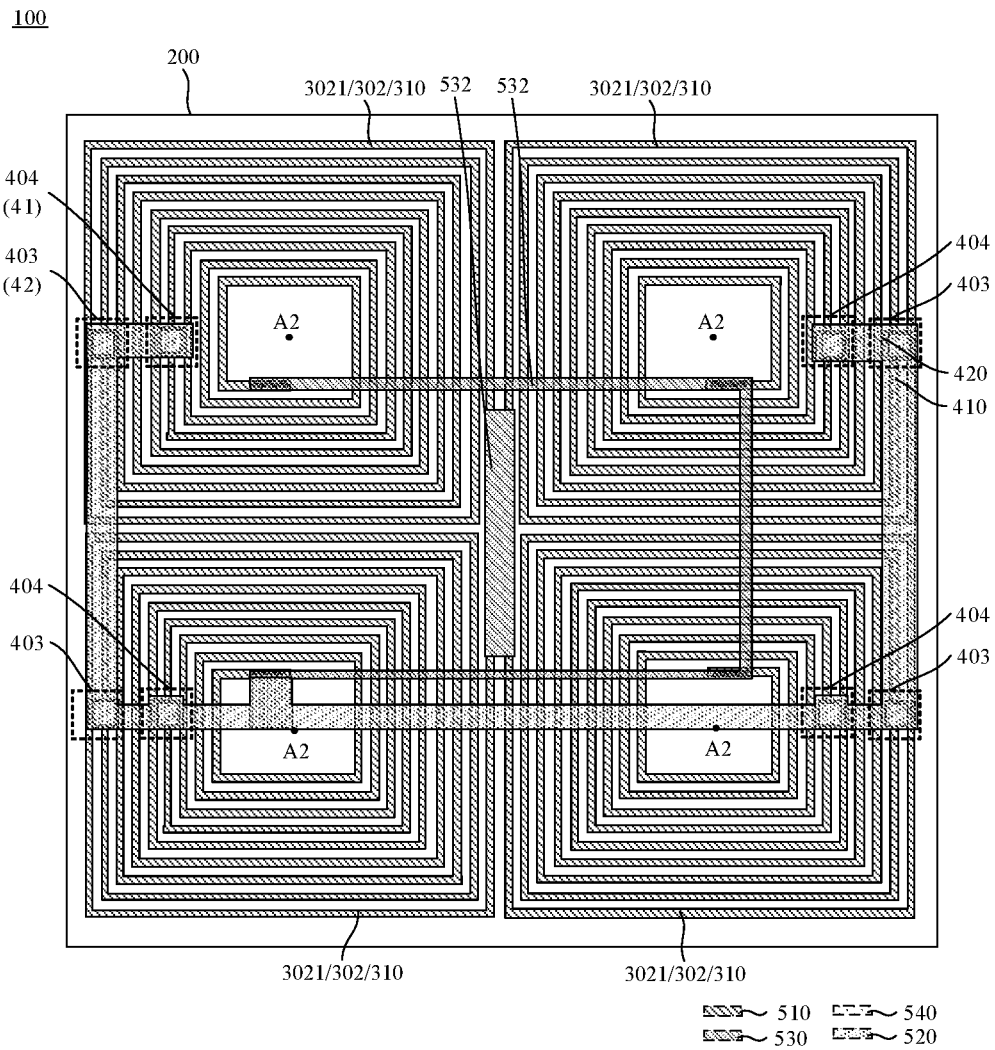
FIG. 42 is a structural diagram of a light-emitting device, in accordance with some embodiments.

Referring to FIGS. 24 and 42, in some embodiments, the plurality of sub-coils 3021 are arranged in a same layer. In this case, the plurality of sub-coils 3021 are located in a same conductive layer 510, and multiple sub-coils 3021 may be arranged side by side.

The light-emitting device 100 further includes at least one connecting wiring 532, and the connecting wiring 532 is located on a side of the plurality of sub-coils 3021 away from the substrate 200. For example, the connecting wiring(s) 532 may be disposed in the first electrode layer 520 and/or the second electrode layer 530.

Ends of the plurality of sub-coils 3021 proximate to respective second central points A2 surrounded thereby are electrically connected through a connecting wiring 532. The connecting wiring 532 and the plurality of sub-coils 302 are disposed in different layers. Therefore, the connecting wiring 532 and the ends of the plurality of sub-coils 302 proximate to the respective second central points A2 surrounded thereby are connected through via holes.

As shown in FIG. 42, ends of the plurality of sub-coils 3021 away from the respective second central points A2 surrounded thereby are electrically connected through another connecting wiring 532. The connecting wiring connected to the ends of the plurality of sub-coils 3021 away from the respective second central points A2 surrounded thereby may be disposed in a same layer as the connecting wiring 532 connected to the ends of the plurality of sub-coils 3021 proximate to the respective second central points A2 surrounded thereby. Of course, the connecting wirings may also be disposed in different layers.

In some embodiments, in the first electrode 410 and the second electrode 420 of the light-emitting unit 400, one is closer to the substrate 200 than the other one. The connecting wiring(s) 532 are arranged in a same layer as the one that is closer to the substrate 200 in the first electrode 410 and the second electrode 420.

In some examples, the first electrode 410 is located on a side of the second electrode 420 away from the substrate 200. In this case, a distance between the second electrode 420 and the substrate 200 is smaller. In the examples, the connecting wiring(s) 532 are arranged in the same layer as the second electrode 420.

In some other examples, the second electrode 420 is located on a side of the first electrode 410 away from the substrate 200. In this case, a distance between the first electrode 410 and the substrate 200 is smaller. In the examples, the connecting wiring(s) 532 are arranged in the same layer as the first electrode 410.

In addition to the embodiments in which the ends of the plurality of sub-coils 3021 away from the respective second central points A2 surrounded thereby are electrically connected through the another connecting wiring, in some other embodiments, referring to FIG. 24, the ends of the plurality of sub-coils 3021 away from the respective second central points A2 surrounded thereby converge to a same position. In this case, the number of via holes in the light-emitting device 100 may be reduced, and thus the stability of the light-emitting device 100 is improved.

The plurality of film layers in the light-emitting device 100 are described below by taking an example in which the ends of the plurality of sub-coils 3021 proximate to the respective second central points A2 surrounded thereby are electrically connected through one connecting wiring 532, and the ends of the plurality of sub-coils 3021 away from the respective second central points A2 surrounded thereby converge to the same position.

Figure 25:
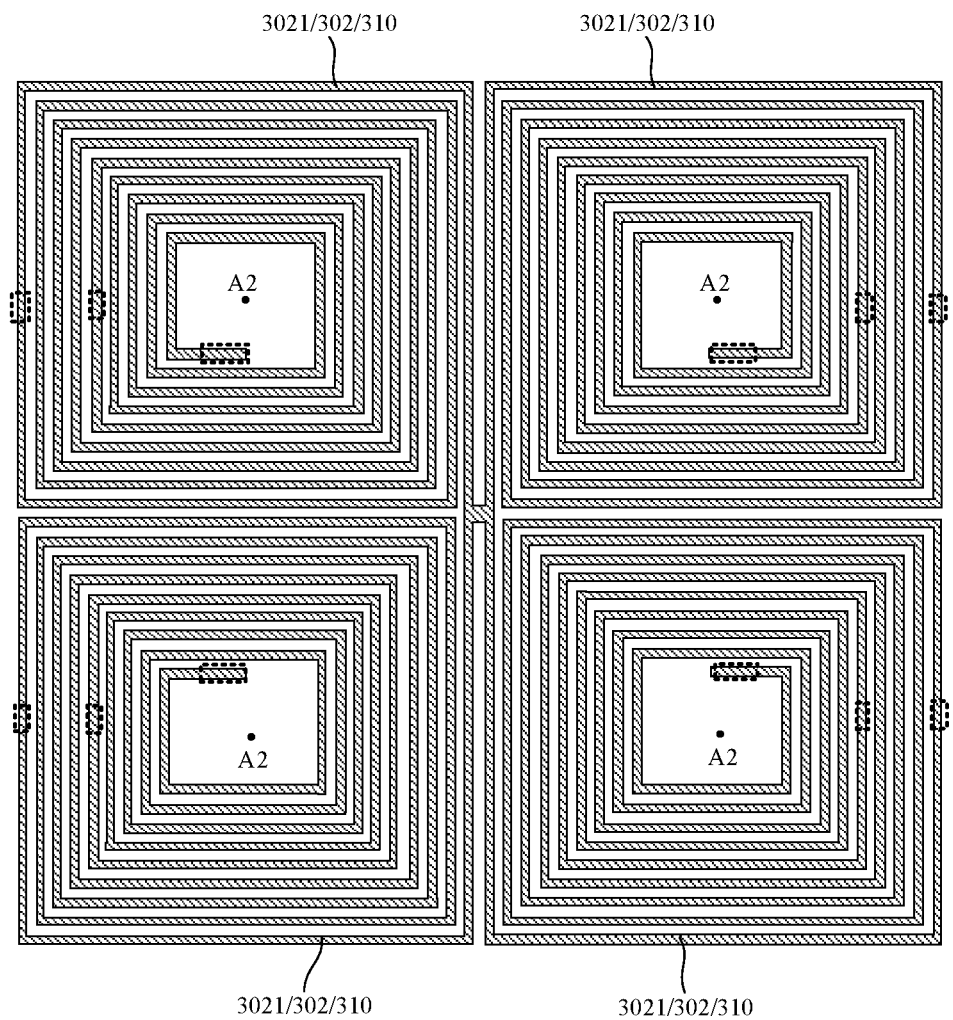
FIG. 25 is a structural diagram of a conductive layer of a light-emitting device, in accordance with some embodiments.

FIG. 25 is a structural diagram of the conductive layer 510 of the light-emitting device 100, in accordance with some embodiments.

Referring to FIG. 25, the plurality of sub-coils 3021 are included in the conductive layer 510, and the ends of the plurality of sub-coils 3021 away from the respective second central points A2 surrounded thereby converge to the same position, so that the end of each of the plurality of sub-coils 3021 away from the respective second central point A2 surrounded thereby is electrically connected to one another.

The plurality of sub-coils 3021 have the same inner diameter, the same outer diameter and the same number of turns.

After the conductive layer 510 is formed, the insulating layer 550 is formed on the side of the conductive layer 510 away from the substrate 200.

Figure 26:
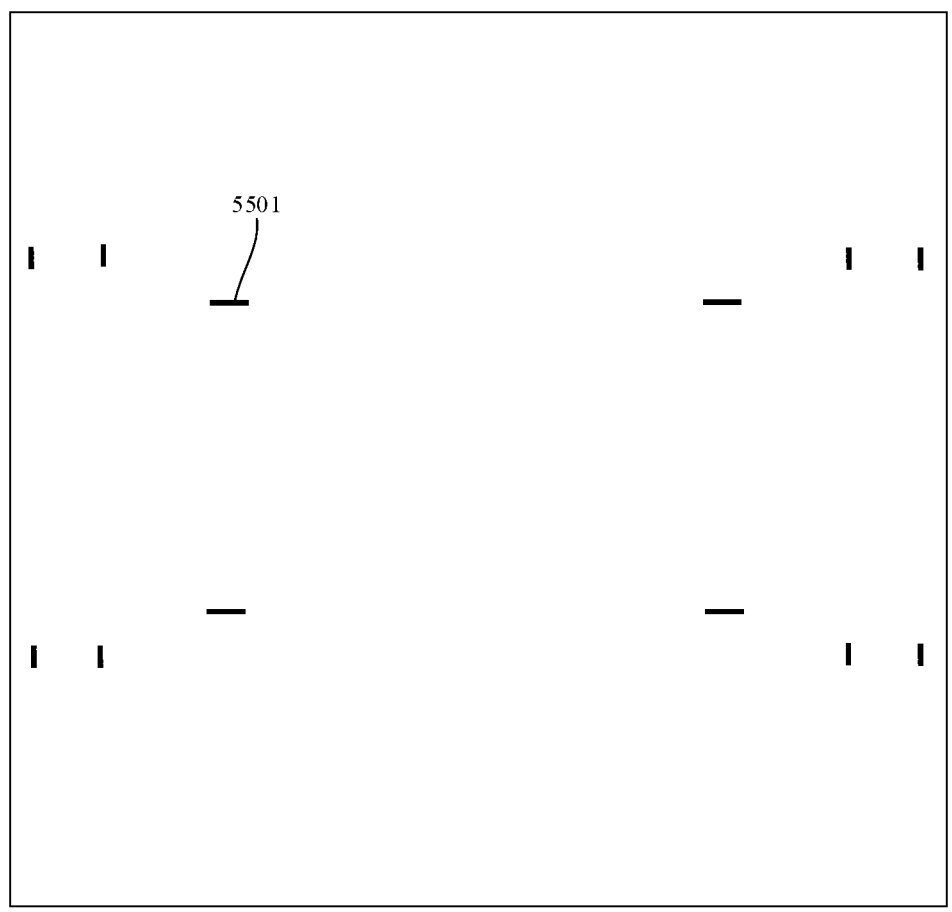
FIG. 26 is a structural diagram of an insulating layer of a light-emitting device, in accordance with some embodiments.

FIG. 26 is a structural diagram of the insulating layer 550 of the light-emitting device 100, in accordance with some embodiments.

The insulating layer 550 is located on the side of the conductive layer 510 away from the substrate 200, and the substrate 200 may be referred to FIG. 24.

Referring to FIG. 26, a plurality of via holes 5501 are formed in the insulating layer 550.

Figure 27:
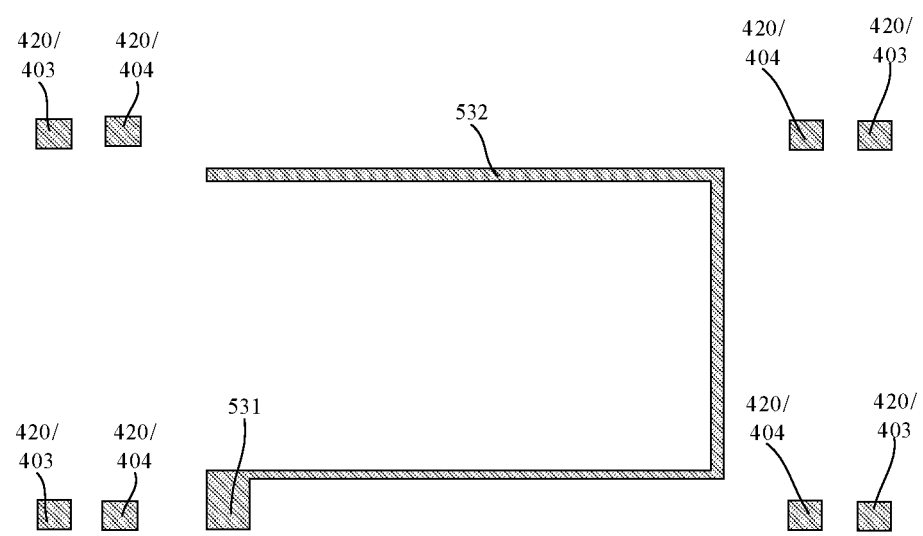
FIG. 27 is a structural diagram of a second electrode layer of a light-emitting device, in accordance with some embodiments.

FIG. 27 is a structural diagram of the second electrode layer 530 of the light-emitting device 100, in accordance with some embodiments.

Referring to FIG. 27, the second electrode layer 530 includes the plurality of second electrodes 420, the bridging pattern 531 and a connecting wiring 532. The bridging pattern 531 is connected to the connecting wiring 532, and the bridging pattern 531 is connected, through a via hole 5501, to an end of a sub-coil 3021 proximate to a respective second central point A2 surrounded thereby; the connecting wiring 532 is connected, through a remaining via hole 5501, to an end of each of the other sub-coils 3021 proximate to the respective second central point A2 surrounded thereby. The sub-coils 3021 are not shown in FIG. 27, but may refer to FIG. 24.

Figure 28:
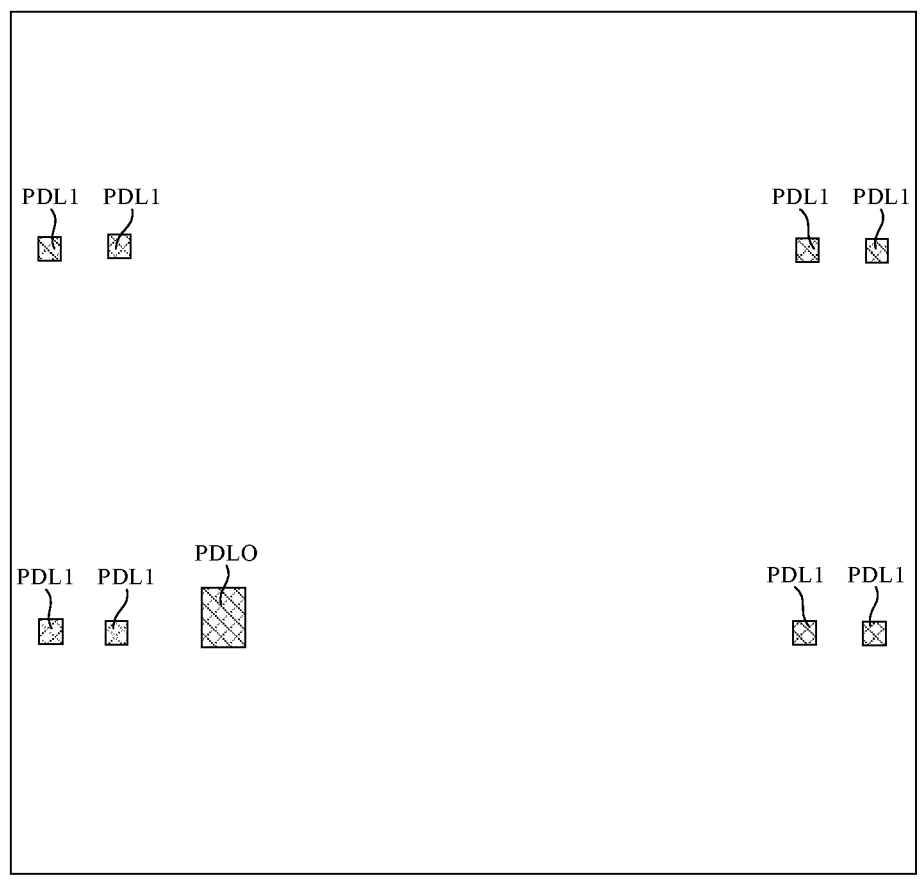
FIG. 28 is a structural diagram of a pixel defining layer of a light-emitting device, in accordance with some embodiments.

FIG. 28 is a structural diagram of the pixel defining layer PDL of the light-emitting device 100, in accordance with some embodiments.

Referring to FIG. 28, the plurality of pixel openings PDL1 are formed in the pixel defining layer PDL. In addition to the pixel openings PDL1, the pixel defining layer PDL further includes a plurality of via holes PDLO.

FIG. 29 is a structural diagram of the light-emitting film layer 540 of the light-emitting device 100, in accordance with some embodiments.

Referring to FIG. 29, the light-emitting film layer 540 includes the plurality of light-emitting layers EML, and a light-emitting layer EML is located in a pixel opening PDL1.

Figure 30:
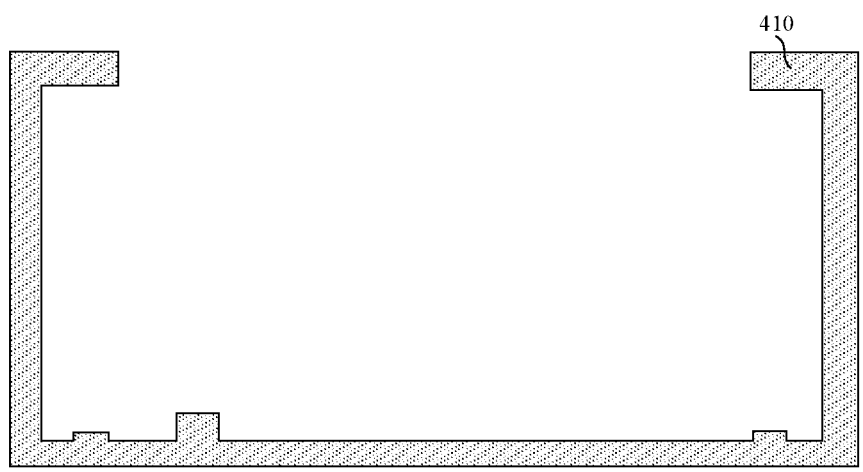
FIG. 30 is a structural diagram of a first electrode layer of a light-emitting device, in accordance with some embodiments.

FIG. 30 is a structural diagram of the first electrode layer 520 of the light-emitting device 100, in accordance with some embodiments.

Referring to FIG. 30, the first electrode layer 520 includes the first electrodes 410, and the first electrode 410 may be connected to the bridging pattern 531 (as shown in FIG. 27) through a via hole PDLO.

In addition to the embodiments in which the plurality of sub-coils 3021 are located in the same film layer, in some other embodiments, the plurality of sub-coils 3021 may also be disposed in different film layers.

Figure 31:
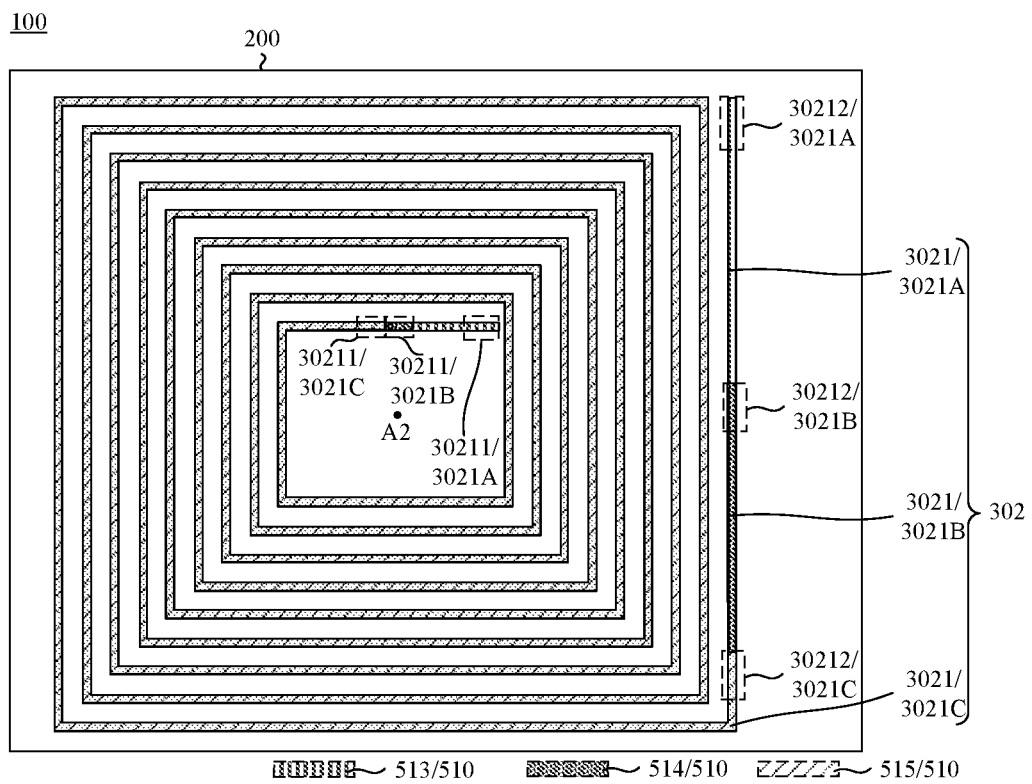
FIG. 31 is a structural diagram of a plurality of sub-coils in a light-emitting device, in accordance with some embodiments.

FIG. 31 is a structural diagram of the plurality of sub-coils 3021 in the light-emitting device 100, in accordance with some embodiments.

Referring to FIG. 31, in some embodiments, the plurality of sub-coils 3021 are sequentially arranged in a thickness direction of the substrate 200 and away from the substrate 200, and orthographic projections of the plurality of sub-coils 3021 on the substrate 200 are at least partially overlapped.

For example, referring to FIG. 31, the second-type induction coil 302 includes three sub-coils 3021. For the convenience of distinction, the three sub-coils 3021 are marked as a sub-coil 3021A, a sub-coil 3021B and a sub-coil 3021C. The sub-coil 3021A, sub-coil 3021B and sub-coil 3021C are away from the substrate 200 in sequence.

In some examples, the orthographic projections of the plurality of sub-coils 3021 on the substrate 200 are completely overlapped. In this case, ends of two adjacent sub-coils 3021 proximate to respective second central points A2 surrounded thereby are connected through a via hole, and ends of the two adjacent sub-coils 3021 away from the respective second central points A2 surrounded thereby are connected through another via hole.

In some other examples, the orthographic projections of the plurality of sub-coils 3021 on the substrate 200 are partially overlapped. In some embodiments, referring to FIG. 31, in any two adjacent sub-coils 3021, an orthographic projection, on the substrate 200, of at least one end of a sub-coil 3021 that is closer to the substrate 200 is located outside of an orthographic projection, on the substrate 200, of a sub-coil 3021 that is farther away from the substrate 200.

A sub-coil 3021 has two ends, and the two ends are an end proximate to a respective second central point A2 surrounded thereby and an end away from the respective second central point A2 surrounded thereby. For the convenience of description, the end of the sub-coil 3021 proximate to the respective second central point A2 surrounded thereby may be defined as a head end 30211, and the end of the sub-coil 3021 away from the respective second central point A2 surrounded thereby may be defined as a tail end 30212. In addition, a portion of the sub-coil 3021 other than the head end and the tail end is defined as a coil body, and the head end 30211 and the tail end 30212 are located at two ends of the coil body, respectively.

In some examples, in any two adjacent sub-coils 3021, an orthographic projection, on the substrate 200, of the head end 30211 of the sub-coil 3021 that is closer to the substrate 200 is located outside of the orthographic projection, on the substrate 200, of the sub-coil 3021 that is farther away from the substrate 200. Therefore, orthographic projections, on the substrate 200, of head ends 30211 of any two adjacent sub-coils 3021 are not overlapped.

In some examples, in any two adjacent sub-coils 3021, the head end 30211 of the sub-coil 3021 that is farther away from the substrate 200 is connected, through a via hole, to the coil body of the sub-coil 3021 that is closer to the substrate 200. Since the orthographic projections, on the substrate 200, of the head ends 30211 of any two adjacent sub-coils 3021 are not overlapped, it may be possible to avoid that via holes are continuously arranged at the head end 30211 of any one of the sub-coils 3021, thereby avoiding the connection reliability between two adjacent sub-coils 3021 from being reduced.

In some examples, in any two adjacent sub-coils 3021, an orthographic projection, on the substrate 200, of the tail end 30212 of the sub-coil 3021 that is closer to the substrate 200 is located outside of the orthographic projection, on the substrate 200, of the sub-coil 3021 that is farther away from the substrate 200. Therefore, orthographic projections, on the substrate 200, of tail ends 30212 of any two adjacent sub-coils 3021 are not overlapped.

In some examples, in any two adjacent sub-coils 3021, the tail end 30212 of the sub-coil 3021 that is farther away from the substrate 200 is connected, through a via hole, to the coil body of the sub-coil 3021 that is closer to the substrate 200. Since the orthographic projections, on the substrate 200, of the tail ends 30212 of any two adjacent sub-coils 3021 are not overlapped, it may be possible to avoid that via holes are continuously arranged at the tail end 30212 of any one of the sub-coils 3021, thereby avoiding the connection reliability between two adjacent sub-coils 3021 from being reduced.

Some embodiments above will be illustrated below by taking an example in which the second-type induction coil 302 includes the sub-coil 3021A, the sub-coil 3021B and the sub-coil 3021C.

Referring to FIG. 31, the sub-coil 3021A, the sub-coil 3021B and the sub-coil 3021C are away from the substrate 200 in sequence. In this case, the light-emitting device 100 includes three conductive layers 510, and the three conductive layers 510 are a third conductive layer 513, a fourth conductive layer 514 and a fifth conductive layer 515.

In some examples, referring to FIG. 31, an orthographic projection of the sub-coil 3021A on the substrate 200 may cover orthographic projections of the head end 30211 and the tail end 30212 of the sub-coil 3021B on the substrate 200. The head end 30211 and the tail end 30212 of the sub-coil 3021B are connected to the coil body of the sub-coil 3021A through via holes.

An orthographic projection of the sub-coil 3021B on the substrate 200 may cover orthographic projections of the head end 30211 and the tail end 30212 of the sub-coil 3021C on the substrate 200. The head end 30211 and the tail end 30212 of the sub-coil 3021C are connected to the coil body of the sub-coil 3021B through via holes.

Since the head end 30211 of the sub-coil 3021C and the head end 30211 of the sub-coil 3021B are not overlapped, it may be possible to avoid that via holes are continuously provided at the head end 30211 of a sub-coil 3021. Similarly, since the tail end 30212 of the sub-coil 3021C and the tail end 30212 of the sub-coil 3021B are not overlapped, it may be possible to avoid that via holes are continuously provided at the tail end 30212 of the sub-coil 3021.

Figure 32:
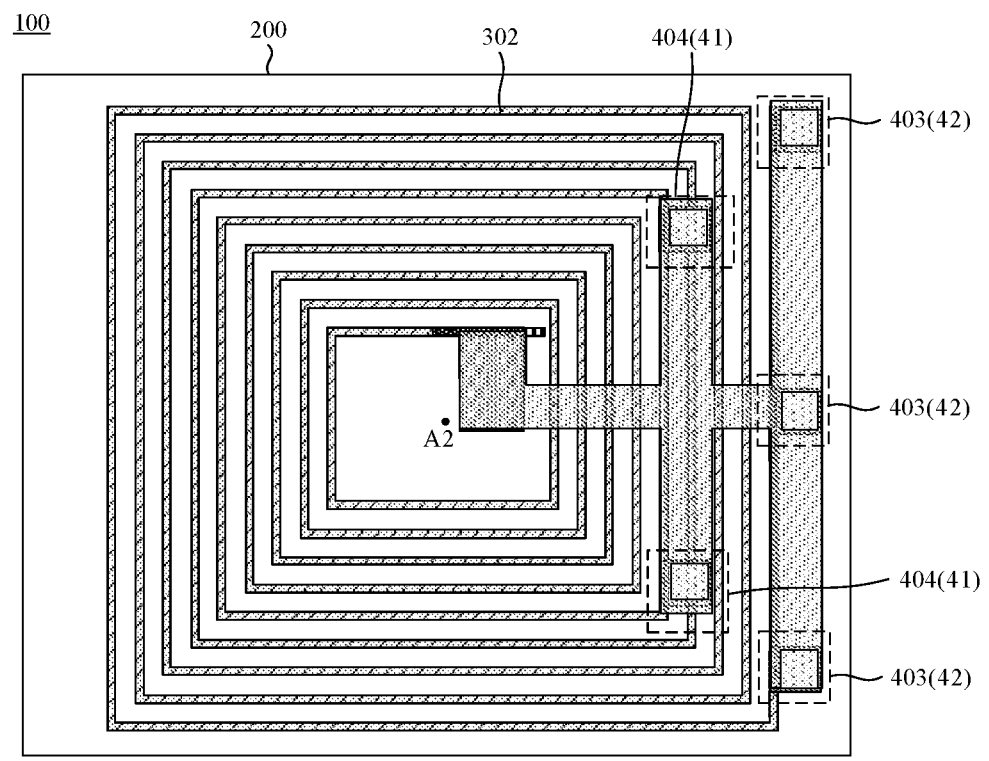
FIG. 32 is a structural diagram of a light-emitting device, in accordance with some embodiments.

FIG. 32 is a structural diagram of the light-emitting device 100, in accordance with some embodiments.

Referring to FIG. 32, for example, the second-type induction coil 302 is connected to third kind of light-emitting units 403 and fourth kind of light-emitting units 404. It can be known from the above that, the equivalent number of turns corresponding to the third kind of light-emitting unit 403 is eight, and the equivalent number of turns corresponding to the fourth kind of light-emitting unit 404 is four.

Three third kind of light-emitting units 403 are shown in FIG. 32, and the three third kind of light-emitting units 403 are connected to the tail end of the sub-coil 3021A, the tail end of the sub-coil 3021B and the tail end of the sub-coil 3021C, respectively.

Two fourth kind of light-emitting units 404 are shown in FIG. 32, and the two fourth kind of light-emitting units 404 are both connected to a fifth turn of conductive wiring 310 of the sub-coil 3021C.

The third kind of light-emitting unit 403 and the fourth kind of light-emitting unit 404 may be connected to the head end 30211 of any one sub-coil 3021.

The plurality of film layers in the light-emitting device 100 will be described below by taking an example in which the plurality of sub-coils 3021 are sequentially arranged in the thickness direction of the substrate 200 and away from the substrate 200. In this case, the light-emitting device 100 includes a plurality of conductive layers, and the plurality of sub-coils 3021 are arranged in the plurality of conductive layers.

Figure 33:
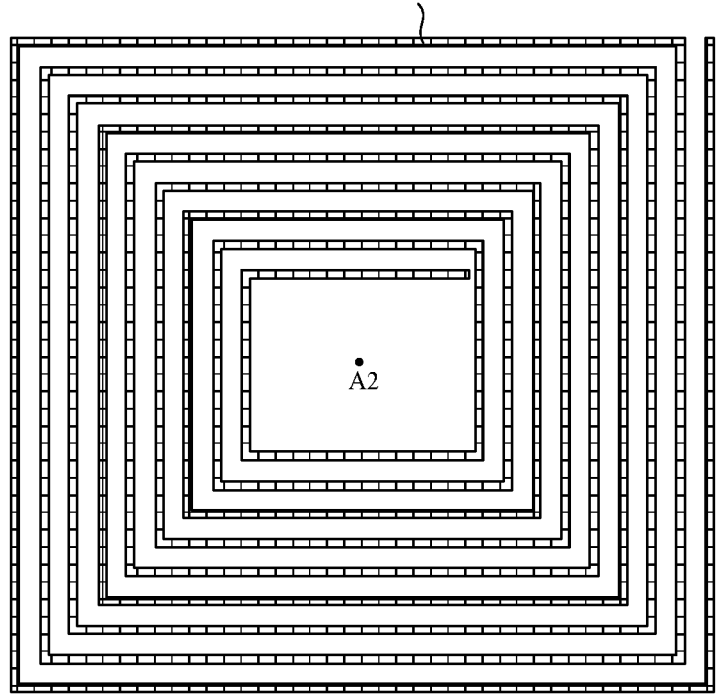
FIG. 33 is a structural diagram of a third conductive layer of a light-emitting device, in accordance with some embodiments.

FIG. 33 is a structural diagram of the third conductive layer 513 of the light-emitting device 100, in accordance with some embodiments.

Referring to FIG. 33, the third conductive layer 513 is located on the side of the substrate 200 (which may refer to FIG. 32), and the sub-coil 3021A is included in the third conductive layer 513.

Figure 34:
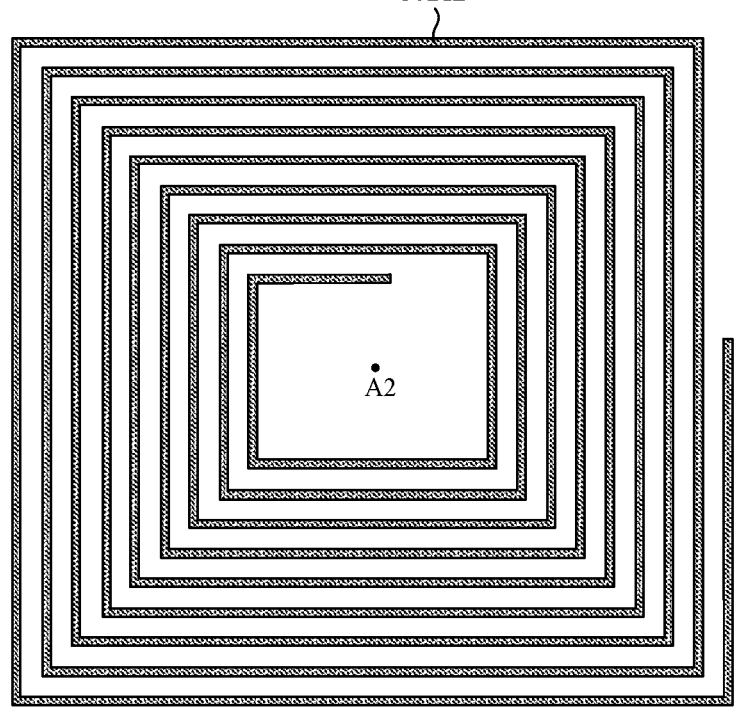
FIG. 34 is a structural diagram of a fourth conductive layer of a light-emitting device, in accordance with some embodiments.

FIG. 34 is a structural diagram of the fourth conductive layer 514 of the light-emitting device 100, in accordance with some embodiments.

Referring to FIG. 34, the fourth conductive layer 514 is located on a side of the third conductive layer 513 (which may refer to FIG. 33) away from the substrate 200 (which may refer to FIG. 32), and the sub-coil 3021B is included in the fourth conductive layer 514.

FIG. 35 is a structural diagram of the fifth conductive layer 515 of the light-emitting device 100, in accordance with some embodiments.

Referring to FIG. 35, the fifth conductive layer 515 is located on a side of the fourth conductive layer 514 (which may refer to FIG. 34) away from the substrate 200 (which may refer to FIG. 32), and the sub-coil 3021C is included in the fifth conductive layer 515.

It will be noted that, insulating layer(s) are formed between the third conductive layer 513 and the fourth conductive layer 514, and insulating layer(s) are formed between the fourth conductive layer 514 and the fifth conductive layer 515, so that two adjacent conductive layers are avoided to be short-circuited.

FIG. 36 is a structural diagram of the second electrode layer 530 of the light-emitting device 100, in accordance with some embodiments.

Referring to FIG. 36, the second electrode layer 530 includes the bridging pattern 531, second electrodes 420 of the third kind of light-emitting units 403 and second electrodes 420 of the fourth kind of light-emitting units 404.

It will be noted that insulating layer(s) are formed between the second electrode layer 530 and the fifth conductive layer 515.

FIG. 37 is a structural diagram of the pixel defining layer PDL of the light-emitting device 100, in accordance with some embodiments.

Referring to FIG. 37, a via hole PDLO and pixel openings PDL1 are formed in the pixel defining layer PDL.

FIG. 38 is a structural diagram of the light-emitting film layer 540 of the light-emitting device 100, in accordance with some embodiments.

Referring to FIG. 38, light-emitting layers EML of the third kind of light-emitting units 403 and light-emitting layers EML of the fourth kind of light-emitting units 404 are included in the light-emitting film layer 540, and a light-emitting layer EML is located in a pixel opening PDL1.

FIG. 39 is a structural diagram of the first electrode layer 520 of the light-emitting device 100, in accordance with some embodiments.

Referring to FIG. 39, the first electrode layer 520 includes the first electrode 410, and the first electrode 410 in the first electrode layer 520 may be connected to the bridging pattern 531 (as shown in FIG. 36) through the via hole PDLO (as shown in FIG. 37).

The first-type induction coil 301 and the second-type induction coil 302 are described above. In some embodiments, the light-emitting device 100 may include first-type induction coil(s) 301 and/or second-type induction coil(s) 302.

In a case where the light-emitting device 100 may include the first-type induction coils 301 and the second-type induction coil(s) 302, part of the first-type induction coils 301 and part of sub-coils 3021 in the second-type induction coil 302 may be disposed in a same conductive layer 510; or the part of the first-type induction coils 301 and the part of the sub-coils 3021 in the second-type induction coil 302 may be disposed in different conductive layers 510.

In summary, for the light-emitting device 100 provided in the embodiments of the present disclosure, the light-emitting units 400 are disposed on the induction coil 300, and the equivalent number of turns of conductive wiring 310 between the first electrode 410 and the second electrode 420 of the first-type light-emitting unit 41 is different from the equivalent number of turns of conductive wiring 310 between the first electrode 410 and the second electrode 420 of the second-type light-emitting unit 42, so that the first-type light-emitting unit 41 and the second-type light-emitting unit 42 may have different luminance.

In some examples, the light-emitting device 100 may be applied to a lighting device. For example, a mobile phone is provided with a coil therein, and the coil in the mobile phone may serve as the driving coil. When the coil in the mobile phone approaches the induction coil 300 in the light-emitting device 100, the light-emitting unit 400 in the light-emitting device 100 may emit light, so as to lighting for users.

In addition, the light-emitting device 100 may also be applied to an electronic tag. In this case, the plurality of light-emitting units 400 in the light-emitting device 100 may display a specific pattern. When the user brings the mobile phone or other device close to the electronic tag, the plurality of light-emitting units 400 may emit light to display the specific pattern.

Moreover, the light-emitting device 100 may also be applied to a counterfeit prevention technology of paper money. When the mobile phone, a smart watch or other device having a coil approaches the light-emitting device 100 in the paper money, the light-emitting unit 400 may emit light, and thus the user may consider the paper money as genuine.

In addition, the light-emitting device 100 may also be applied to an apparatus such as a billboard or a radio frequency card, and the apparatus is not listed here.

FIG. 40 is a structural diagram of a light-emitting apparatus 600, in accordance with some embodiments.

Referring to FIG. 40, some embodiments of the present disclosure provide a light-emitting apparatus 600. The light-emitting apparatus 600 includes a first protective layer 610, a second protective layer 620, and the light-emitting device 100 provided in the embodiments above. The light-emitting device 100 is located between the first protective layer 610 and the second protective layer 610.

Since the light-emitting apparatus 600 provided in the embodiments of the present disclosure includes the light-emitting device 100 provided in the embodiments above, the light-emitting apparatus 600 provided in the embodiments of the present disclosure has all the beneficial effects of the light-emitting device 100 provided in the embodiments above, which will not be repeated here.

In some examples, the first protective layer 610 and the second protective layer 620 may be made of flexible materials.

In some other examples, the first protective layer 610 and the second protective layer 620 may be made of hard materials.

The first protective layer 610 and the second protective layer 620 may protect the light-emitting device 100 from being damaged.

The light-emitting apparatus 600 may be an apparatus such as the lighting apparatus, the paper money, the electronic tag, the radio frequency card or the billboard, which will not be listed here.

FIG. 41 is a flowchart of a method for manufacturing a light-emitting device, in accordance with some embodiments.

Referring to FIG. 41, some embodiments of the present disclosure provide the method for manufacturing the light-emitting device, and the manufacturing method is used to form the light-emitting device 100 provided in some embodiments above. The method for manufacturing the light-emitting device includes the following steps S1 and S2.

In S1, at least one induction coil 300 is formed on the substrate 200. An induction coil 300 includes a plurality of turns of conductive wiring 310.

Referring to FIGS. 4, 5, 14, 15, 24 and 32, the induction coil 300 may be formed by an etching process. The structure of the induction coil 300 has been described in the embodiments above, and will not be repeated here.

In S2, at least two light-emitting units 400 are formed on a side of the at least one induction coil 300 away from the substrate 200. Referring to FIG. 5, the light-emitting unit 400 includes a first electrode 410 and a second electrode 420, and the first electrode 410 and the second electrode 420 of a same light-emitting unit 400 are electrically connected to different turns of conductive wiring 310 of a same induction coil 300. The at least two light-emitting units 300 are divided into a first-type light-emitting unit 41 and a second-type light-emitting unit 42. An equivalent number of turns of conductive wiring between the first electrode 410 and the second electrode 410 of the first-type light-emitting unit 41 is different from an equivalent number of turns of conductive wiring 310 between the first electrode 410 and the second electrode 420 of the second-type light-emitting unit 42.

The equivalent number of turns corresponding to the first-type light-emitting unit 41 is different from the equivalent number of turns corresponding to the second-type light-emitting unit 42, so that the first-type light-emitting unit 41 and the second-type light-emitting unit 42 have different luminance. As a result, the plurality of light-emitting units 400 in the light-emitting device 100 may have different luminance, thereby realizing differentiated light emission.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A light-emitting device, comprising:
a substrate;
at least one induction coil located on a side of the substrate, the induction coil including a plurality of turns of conductive wiring; and
at least two light-emitting units located on a side of the induction coil away from the substrate, wherein each light-emitting unit includes a first electrode and a second electrode, and a first electrode and a second electrode of a same light-emitting unit are electrically connected to different turns of conductive wiring of a same induction coil; the at least two light-emitting units include at least one first-type light-emitting unit and at least one second-type light-emitting unit, and an equivalent number of turns of conductive wiring between a first electrode and a second electrode of a first-type light-emitting unit in the at least one first-type light-emitting unit is different from an equivalent number of turns of conductive wiring between a first electrode and a second electrode of a second-type light-emitting unit in the at least one second-type light-emitting unit.

2. The light-emitting device according to claim 1, wherein
the at least one induction coil includes at least one first-type induction coil;
the first electrode of the first-type light-emitting unit in the at least one first type light-emitting unit and the first electrode of the second-type light-emitting unit in the at least one second-type light-emitting unit are electrically connected to a designated end of a first-type induction coil in the at least one first-type induction coil; the second electrode of the first-type light-emitting unit in the at least one first-type light-emitting unit and the second electrode of the second-type light-emitting unit in the at least one second-type light-emitting unit are electrically connected to different turns of conductive wiring of the first-type induction coil in the at least one first-type induction coil; and
the first-type induction coil is helically disposed around a first central point thereof and spreads out; the designated end of the first-type induction coil is an end of the first-type induction coil proximate to the first central point, or an end of the first-type induction coil away from the first central point.

3. The light-emitting device according to claim 2, wherein a plurality of first-type induction coils are provided, and
the plurality of first-type induction coils are insulated from each other.

4. The light-emitting device according to claim 3, wherein regions surrounded by outermost turns of conductive wirings of at least two first-type induction coils are partially overlapped in a thickness direction of the substrate.

5. The light-emitting device according to claim 2, wherein the first-type light-emitting unit and the second-type light-emitting unit share the first electrode.

6. The light-emitting device according to claim 3, further comprising at least one conductive layer, wherein
the plurality of first-type induction coils are located in a same conductive layer or at least two conductive layers.

7. The light-emitting device according to claim 4, wherein conductive wirings of the at least two first-type induction coils are partially overlapped.

8. The light-emitting device according to claim 4, wherein an orthographic projection, on the substrate, of an end of any one of the plurality of first-type induction coils proximate to a first central point thereof does not overlap with an orthographic projection, on the substrate, of a conductive wiring of any other of the plurality of first-type induction coils.

9. The light-emitting device according to claim 1, wherein the at least one induction coil includes a second-type induction coil, and the second-type induction coil includes a plurality of sub-coils; each sub-coil is helically disposed around a respective second central point thereof and spreads out; an end of each sub-coil proximate to the respective second central point surrounded thereby is electrically connected to one another to form a first connection end, and an end of each sub-coil away from the respective second central point surrounded thereby is electrically connected to one another to form a second connection end;
the first electrode of the first-type light-emitting unit in the at least one first-type light-emitting unit and the first electrode of the second-type light-emitting unit in the at least one second-type light-emitting unit are electrically connected to a designated end of the second-type induction coil, and the second electrode of the first-type light-emitting unit in the at least one first-type light-emitting unit and the second electrode of the second-type light-emitting unit in the as least one second-type light-emitting unit are electrically connected to different turns of conductive wiring of the second-type induction coil; and
the designated end of the second-type induction coil is the first connection end or the second connection end.

10. The light-emitting device according to claim 9, wherein
a plurality of first-type light-emitting units are provided, and second electrodes of the plurality of first-type light-emitting units are electrically connected to conductive wirings of sub-coils in the plurality of sub-coils, the conductive wirings being in a same turn; and/or
a plurality of second-type light-emitting units are provided, and second electrodes of the plurality of second-type light-emitting units are electrically connected to conductive wirings of sub-coils in the plurality of sub-coils, the conductive wirings being in a same turn.

11. The light-emitting device according to claim 9, wherein
the plurality of sub-coils are arranged in a same layer;
the light-emitting device further comprises at least one connecting wiring located on a side of the plurality of sub-coils away from the substrate;
ends of the plurality of sub-coils proximate to respective second central points surrounded thereby are electrically connected through a connecting wiring; and
ends of the plurality of sub-coils away from the respective second central points surrounded thereby are electrically connected through another connecting wiring; or
the ends of the plurality of sub-coils away from the respective second central points surrounded thereby converge to a same position.

12. The light-emitting device according to claim 11, wherein
one of the first electrode and the second electrode of the light-emitting unit is closer to the substrate than another thereof;
the at least one connecting wiring is arranged in a same layer as the one of the first electrode and the second electrode closer to the substrate.

13. The light-emitting device according to claim 9, wherein
the plurality of sub-coils are sequentially arranged in a thickness direction of the substrate and away from the substrate, and orthographic projections of the plurality of sub-coils on the substrate are at least partially overlapped.

14. The light-emitting device according to claim 13, wherein
in any two adjacent sub-coils, an orthographic projection, on the substrate, of at least one end of a sub-coil that is closer to the substrate is located outside of an orthographic projection, on the substrate, of a sub-coil that is farther away from the substrate.

15. The light-emitting device according to claim 14, wherein
each sub-coil includes a head end and a tail end; the head end is the end of the sub-coil proximate to the respective second central point surrounded thereby, and the tail end is the end of the sub-coil away from the respective second central point surrounded thereby, wherein
in the two adjacent sub-coils, an orthographic projection, on the substrate, of a head end of the sub-coil that is closer to the substrate is located outside of the orthographic projection, on the substrate, of the sub-coil that is farther away from the substrate; or
in the two adjacent sub-coils, an orthographic projection, on the substrate, of a tail end of the sub-coil that is closer to the substrate is located outside of the orthographic projection, on the substrate, of the sub-coil that is farther away from the substrate.

16. The light-emitting device according to claim 14, wherein
each sub-coil includes a head end and a tail end; the head end is the end of the sub-coil proximate to the respective second central point surrounded thereby, and the tail end is the end of the sub-coil away from the respective second central point surrounded thereby, wherein
in an orthographic projection, on the substrate, of a head end of the sub-coil that is closer to the substrate is located outside of the orthographic projection, on the substrate, of the sub-coil that is farther away from the substrate; and in the two adjacent sub-coils, an orthographic projection, on the substrate, of a tail end of the sub-coil that is closer to the substrate is located outside of the orthographic projection, on the substrate, of the sub-coil that is farther away from the substrate.

17. The light-emitting device according to claim 1, wherein the light-emitting device comprises:
a first electrode layer and a second electrode layer, both of which are located on the side of the induction coil away from the substrate, wherein the first electrode layer is located on a side of the second electrode layer away from the substrate; the first electrode of each light-emitting unit is included in the first electrode layer, and the second electrode of each light-emitting unit is included in the second electrode layer;
the second electrode layer further includes a bridging pattern, the first electrode of each light-emitting unit is connected to the bridging pattern through a via hole, and the bridging pattern is connected to the induction coil through another via hole;
the second electrode of each light-emitting unit is electrically connected to the induction coil through yet another via hole.

18. The light-emitting device according to claim 1, wherein
each light-emitting unit further includes a light-emitting layer located between the first electrode and the second electrode.

19. A light-emitting apparatus, comprising:
a first protective layer and a second protective layer; and
the light-emitting device according to claim 1, wherein the light-emitting device is located between the first protective layer and the second protective layer.

20. A method for manufacturing a light-emitting device, comprising:
forming at least one induction coil on a substrate, wherein the induction coil includes a plurality of turns of conductive wiring; and
forming at least two light-emitting units on a side of the at least one induction coil away from the substrate, wherein each light-emitting unit includes a first electrode and a second electrode, and a first electrode and a second electrode of a same light-emitting unit are electrically connected to different turns of conductive wiring of a same induction coil; the at least two light-emitting units include a first-type light-emitting unit and a second-type light-emitting unit, and an equivalent number of turns of conductive wiring between a first electrode and a second electrode of the first-type light-emitting unit is different from an equivalent number of turns of conductive wiring between a first electrode and a second electrode of the second-type light-emitting unit.

* * * * *